US010050628B2

(12) United States Patent
Kim et al.

(10) Patent No.: US 10,050,628 B2
(45) Date of Patent: Aug. 14, 2018

(54) FIELD-PROGRAMMABLE ANALOG ARRAY AND FIELD PROGRAMMABLE MIXED SIGNAL ARRAY USING SAME

(71) Applicant: SNU R&DB FOUNDATION, Seoul (KR)

(72) Inventors: Jae Ha Kim, Seoul (KR); Yoon Taek Lee, Seoul (KR); Yun Ju Choi, Incheon (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 15/511,912

(22) PCT Filed: Sep. 16, 2015

(86) PCT No.: PCT/KR2015/009715
§ 371 (c)(1),
(2) Date: May 25, 2017

(87) PCT Pub. No.: WO2016/043516
PCT Pub. Date: Mar. 24, 2016

(65) Prior Publication Data
US 2017/0264299 A1    Sep. 14, 2017

(30) Foreign Application Priority Data

Sep. 17, 2014    (KR) .................. 10-2014-0123472

(51) Int. Cl.
*H03K 19/177*    (2006.01)
*H03L 7/08*    (2006.01)
(Continued)

(52) U.S. Cl.
CPC ......... *H03K 19/17748* (2013.01); *H03K 7/08* (2013.01); *H03K 19/1774* (2013.01); *H03L 7/091* (2013.01)

(58) Field of Classification Search
None
See application file for complete search history.

(56) References Cited

U.S. PATENT DOCUMENTS

| 5,680,070 A | * | 10/1997 | Anderson | ................ | G06G 7/06 |
| | | | | | 327/336 |
| 7,825,688 B1 | * | 11/2010 | Snyder | ...................... | G06F 1/08 |
| | | | | | 326/39 |

(Continued)

FOREIGN PATENT DOCUMENTS

| JP | 08-006809 A | 1/1996 |
| JP | 2002-305438 A | 10/2002 |

(Continued)

OTHER PUBLICATIONS

Sep. 27, 2016, Korean Office Action for related KR application No. 10-2014-0123472.

(Continued)

*Primary Examiner* — Douglas W Owens
*Assistant Examiner* — James H Cho
(74) *Attorney, Agent, or Firm* — Paratus Law Group, PLLC

(57) ABSTRACT

A field-programmable analog array including an array of a plurality of programmable analog timing circuits, the field-programmable analog array being field-programmable to a plurality of analog or analog-to-digital conversion circuits, such as relaxation oscillators, phase shifters, phase interpolators, pulse width modulators, pseudo exponential digitally controlled oscillators, etc. through programming, without physical re-processing of circuit. A field-programmable mixed signal array according to an embodiment of the present invention comprises a plurality of field-programmable analog arrays, field-programmable digital blocks and field-programmable connecting wire blocks, the field-programmable mixed signal array being field-programmable to (Continued)

a plurality of analog, digital or analog-to-digital conversion circuits, such as digital pulse width modulators, time-digital converters, analog-digital converters, phase-locked loops, DC-DC, AC-DC and DC-AC converters through programming, without physical re-processing of circuit.

33 Claims, 28 Drawing Sheets

(51) Int. Cl.
*H03K 7/08* (2006.01)
*H03L 7/091* (2006.01)

(56) References Cited

U.S. PATENT DOCUMENTS

| | | | |
|---|---|---|---|
| 2004/0078179 A1 | 4/2004 | Fuji et al. | |
| 2006/0261846 A1* | 11/2006 | Twigg | H03K 19/173 326/37 |
| 2008/0291758 A1 | 11/2008 | Chu et al. | |
| 2012/0306533 A1* | 12/2012 | Ohmaru | H03K 19/17744 326/41 |
| 2013/0106462 A1 | 5/2013 | Yang et al. | |
| 2014/0070841 A1* | 3/2014 | Seningen | G06F 17/5045 326/16 |

FOREIGN PATENT DOCUMENTS

| | | |
|---|---|---|
| JP | 2004-157986 A | 6/2004 |
| JP | 2012-204898 A | 10/2012 |
| KR | 10-2005-0007447 A | 1/2005 |

OTHER PUBLICATIONS

Jul. 6, 2017, Korean Office Action for related KR application No. 10-2014-0123472.

Diego P. Morales, et al., Enhancing ADC Resolution Through Field Programmable Analog Array Dynamic Reconfiguration, International Conference on Field Programmable Logic and Applications, Sep. 8-10, 2008, pp. 635-638, IEEE Conference Publications.

International Search Report for PCT/KR2015/009715 dated Jan. 15, 2016 from Korean Intellectual Property Office.

* cited by examiner

Fig. 3
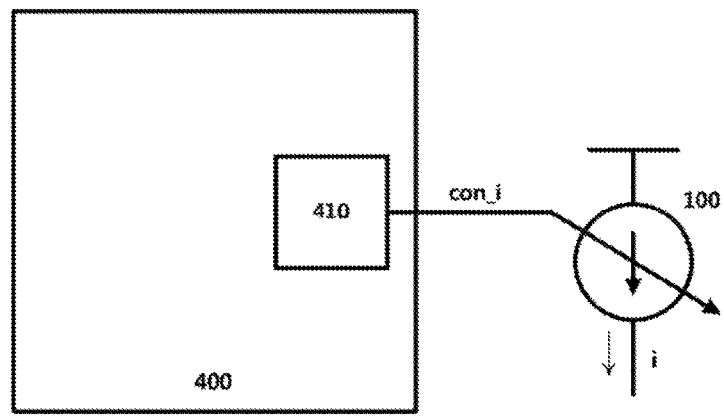
(a)
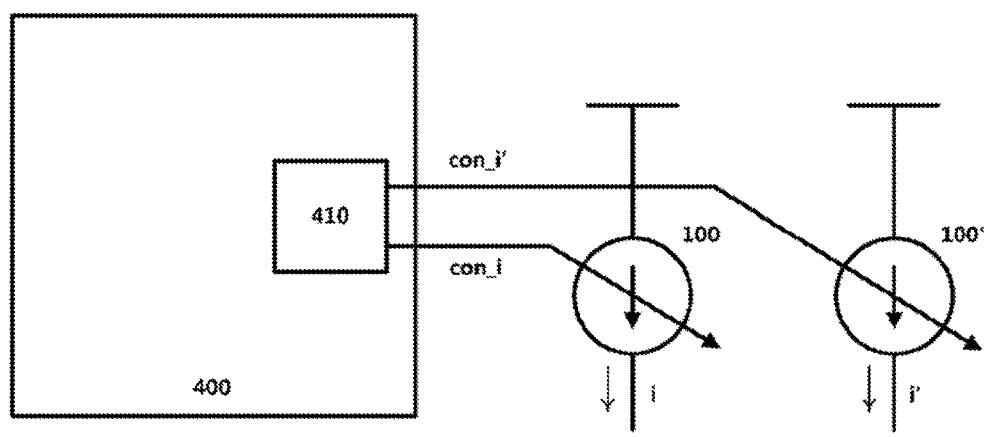
(b)

Fig. 27
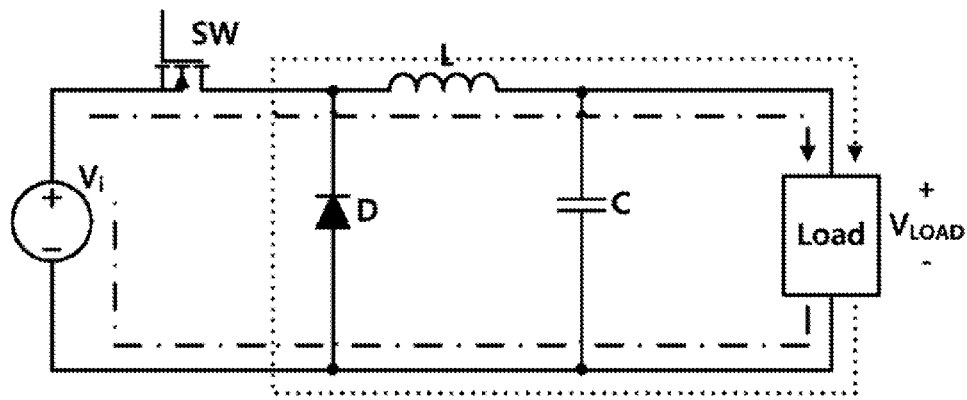
(a)
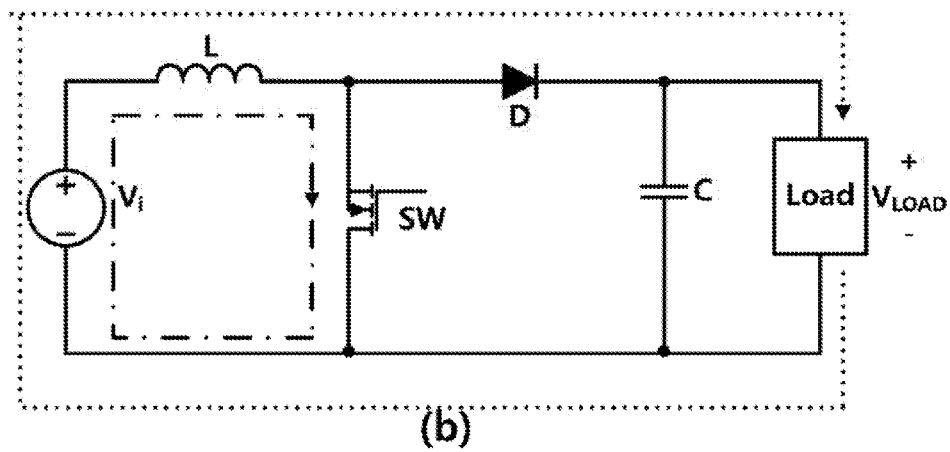
(b)

FIELD-PROGRAMMABLE ANALOG ARRAY AND FIELD PROGRAMMABLE MIXED SIGNAL ARRAY USING SAME

CROSS-REFERENCE TO RELATED APPLICATION

This application is a 371 National Stage Application of PCT International Application No. PCT/KR2015/009715 filed on Sep. 16, 2015, which claims priority to Korean Patent Application No. 10-2014-0123472 filed on Sep. 17, 2014, the entire disclosure of which is incorporated herein by reference in its entirety.

BACKGROUND

The present embodiment relates to a field-programmable analog array and a field-programmable mixed signal array using the same.

In a general digital circuit, a signal to be processed has information of logic 0 and logic 1, and a logic operation, etc. is performed using such information to process target information or a target signal. An analog circuit denotes a circuit that processes a signal which has continuously changing information, such as a changing amplitude, a changing frequency, etc., unlike a digital signal.

In the case of designing a digital circuit for performing signal processing using a signal of logic 0 and logic 1 or verifying a designed circuit, it is possible to describe the digital circuit in a hardware description language (HDL), such as very-high-speed integrated circuits HDL (VHDL), Verilog, etc., and immediately verify operation of the designed circuit by synthesizing a circuit that performs a described function using a field-programmable gate array (FPGA).

However, unlike a digital circuit, a general analog circuit has a problem in that it cannot be synthesized to perform an intended analog function in the field by a program provided by a user.

The present invention has been devised to solve the aforementioned problem and is directed to providing an analog circuit and a chip that make it possible to implement a circuit for performing an analog function intended by a user in the field.

One aspect of the present invention provides a field-programmable analog array including programmable analog timing arrays, wherein the programmable analog timing arrays are reconfigurable through a program to perform operation of a plurality of analog circuits or analog-digital conversion circuits without physical re-processing of circuit.

Another aspect of the present invention provides a field-programmable mixed signal array including at least one field-programmable analog array, at least one field-programmable digital block configured to perform a logic operation which is field-reconfigurable through a program, and at least one field-programmable connecting wire block capable of field-reconfiguring connection states of input signals and output signals of each of the field-programmable analog array and the field-programmable digital block, wherein the field-programmable analog array, the field-programmable digital block, and the field-programmable connecting wire block are reconfigurable through a program to perform operation of a plurality of analog, digital, or analog-digital conversion circuits without physical re-processing of circuit.

A field-programmable mixed signal array and a field-programmable analog array according to embodiments of the present invention provide an advantage in that it is possible to implement a circuit for performing a function intended by a user in the field by adjusting a connective relationship between programmable analog timing arrays through a program.

BRIEF DESCRIPTION OF THE DRAWINGS

FIG. 3 illustrates diagrams showing outlines of a memory and a current source included in a programmable analog timing array according to an embodiment of the present invention.

FIG. 27 illustrates a schematic circuit diagram illustrating operation of a buck converter which is a conventional step-down DC-DC converter, and a schematic circuit diagram illustrating operation of a boost converter which is an existing step up DC-DC converter.

DETAILED DESCRIPTION

Figure 1:
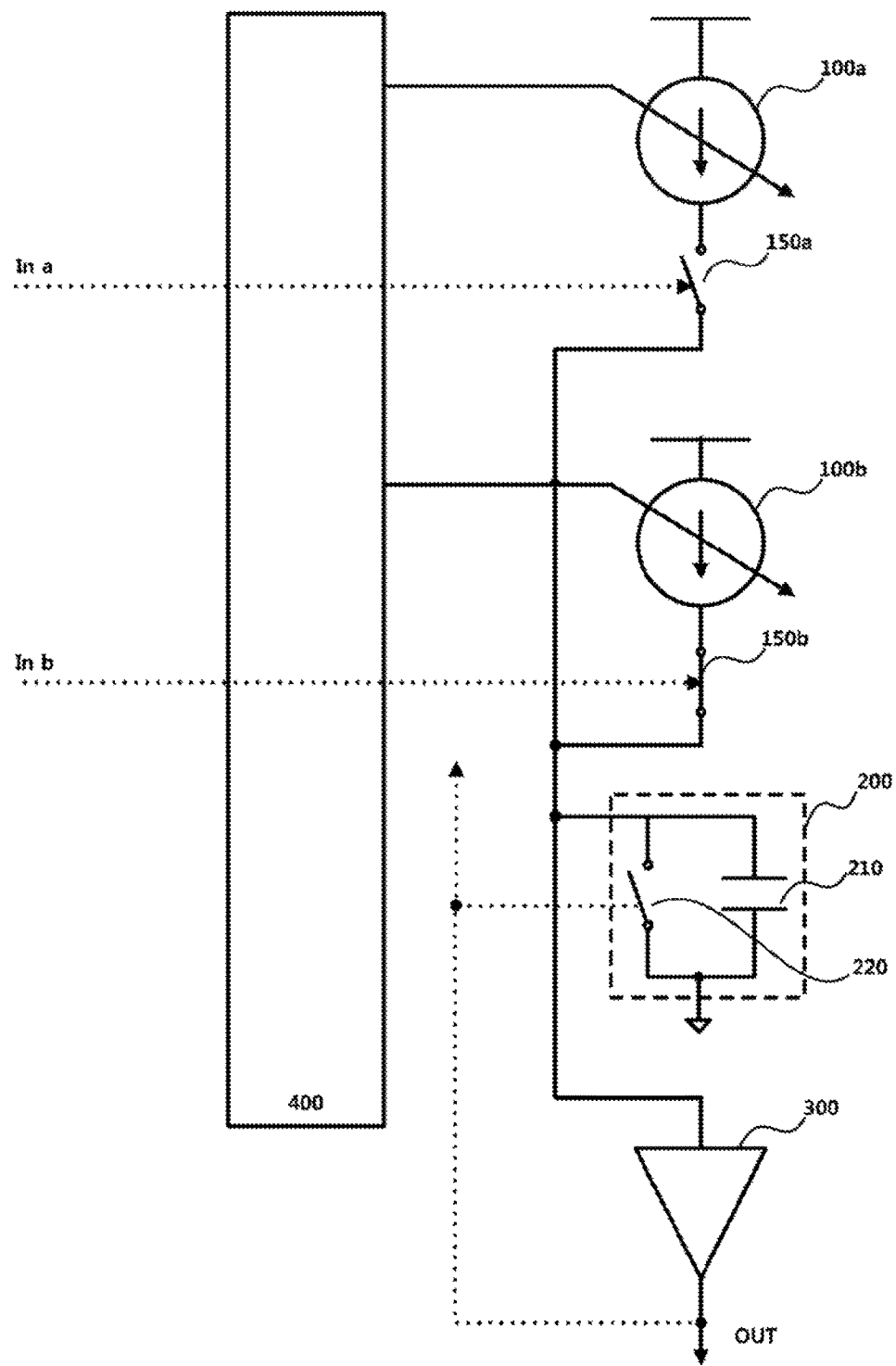
FIG. 1 is a diagram showing an outline of a programmable analog timing array according to an embodiment of the present invention.

Structural and functional details disclosed herein are merely representative for purposes of describing embodiments of the disclosed technology, and the disclosed technology should not be construed as limited to the embodiments. In other words, the embodiments are susceptible to various modifications and alternative forms, and it will be understood that the scope of the disclosed technology covers equivalents capable of implementing the technical spirit.

Meanwhile, the terminology used herein should be understood as follows.

The singular forms are intended to include the plural forms as well, unless the context clearly indicates otherwise. It will be understood that the terms "comprises," "comprising," "includes," or "including," when used herein, specify the presence of stated features, numerals, steps, operations, elements, parts, or combinations thereof, but do not preclude the presence or addition of one or more other features, numerals, steps, operations, elements, parts, or combinations thereof.

Unless a specific sequence is clearly stated in the context, individual steps may be performed in a sequence different from the sequence. In other words, the individual steps may be performed in the specified sequence, substantially at the same time, or in the reverse sequence.

All terms used herein have the same meanings as commonly understood by those of ordinary skill in the art to which the disclosed technology pertains. Terms defined in commonly used dictionaries should be interpreted as having meanings that are consistent with their meanings in the context of related art and will not be interpreted in an idealized or overly formal sense unless meanings thereof are clearly defined so.

It should be understood that, for clear description of embodiments shown in the drawings, size, thickness, length, etc. may be exaggerated.

Hereinafter, a programmable analog timing array according to the present embodiment will be described with reference to the accompanying drawings. In the present specification, types of signal lines are not specified, and each line may be interpreted as a single signal or a bus signal composed of one or more analog signals or digital signals.

Figure 2:
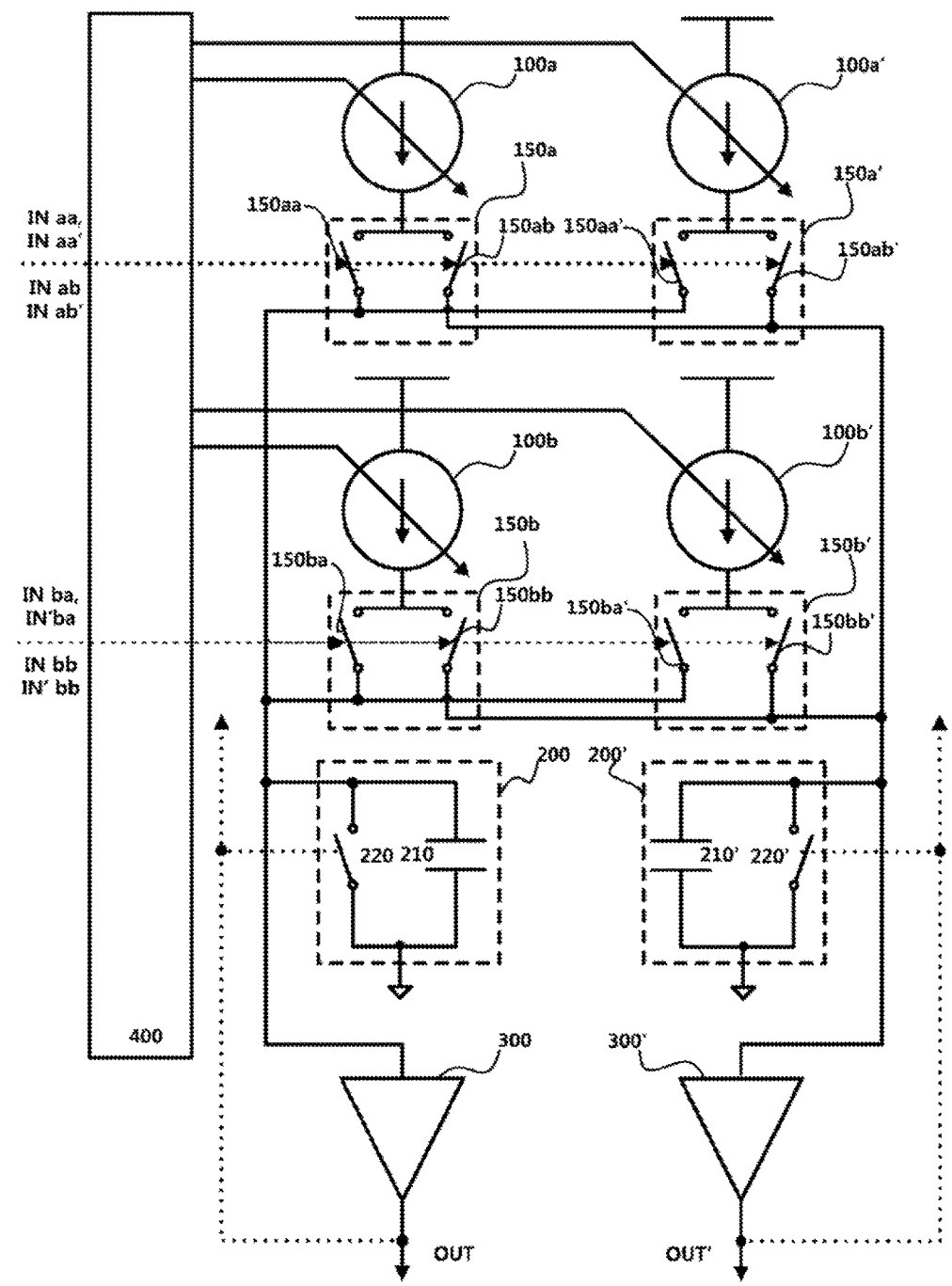
FIG. 2 is a diagram showing an outline of a provided pair of programmable analog timing arrays according to an embodiment of the present invention.

FIG. 1 is a diagram showing an outline of a programmable analog timing array according to an embodiment of the present invention, and FIG. 2 is a diagram showing an outline of a provided pair of programmable analog timing arrays according to an embodiment of the present invention.

Referring to FIGS. 1 and 2, currents applied by current sources 100$a$, 100$b$, 100$a'$, 100$b'$ are controlled by a program stored in a memory 400.

FIGS. 3A and 3B are diagrams showing outlines of a memory 400 and current sources 100 and 100' included in programmable analog timing arrays according to an embodiment of the present invention. When a programmable analog timing array according to an embodiment of the present invention operates in a single-ended fashion as shown in FIG. 3A, a digital-analog converter (DAC) 410 for controlling a current converts a code included in a program to generate a current control signal con_i corresponding to the code and applies the current control signal con_i to the current source 100, thereby controlling a current i provided by the current source 100.

When programmable analog timing arrays according to an embodiment of the present invention operate in pairs as shown in FIGS. 2 and 3B, the DAC 410 converts a code included in a program and generates and applies current control signals con_i and con_i' to the current sources 100 and 100' so that each of the current sources 100 and 100' operates according to the code. As an example, when the provided pair of programmable analog timing arrays are programmed to operate complementarily to each other, the DAC 410 converts a code included in the program and generates and applies the current control signals con_i and con_i' to the current sources 100 and 100' so that the current sources 100 and 100' operate complementarily to each other. For example, the code for controlling a current value may be a predetermined number of bits, and the DAC 410 may generate a signal for controlling a current value to a resolution corresponding to the bits of the code and thereby control a current source. However, this is an example, and the code provided by the memory may include various codes, such as control codes for controlling a state of a variable current source, etc. as well as a current value of a current source.

For example, even when programmable analog timing arrays according to an embodiment of the present invention operate in a single-ended fashion or complementarily to each other, a current value applied by a current source can be adjusted by a program.

Referring back to FIGS. 1 and 2, switch units 150$a$, 150$b$, 150$a'$, and 150$b'$ are controlled with control signals IN aa, IN ab, IN aa', IN ab', IN ba, IN bb, IN ba', and IN bb' to apply currents applied by the current sources 150$a$, 150$b$, 150$a'$, and 150$b'$ to charge accumulation means 200 and 200' or block the currents. As an example, when a programmable analog timing array is provided and operates in a single-ended fashion as shown in the embodiment of FIG. 1, conduction of the switches 150$a$ and 150$b$ is controlled by control signals In a and In b to apply currents applied by the current sources 100$a$ and 100$b$ to a charge accumulation means or block the currents. As will be described below, a control signal may be applied from the outside during operation of the programmable analog timing array. The signal applied from the outside is stored in a memory, and operation of the programmable analog timing array is controlled by the signal.

In an embodiment in which programmable analog timing arrays are provided and operate in pairs as shown in FIG. 2, the switch units 150$a$, 150$b$, 150$a'$, and 150$b'$ include switches in pairs to provide a current of any one single end to the other single end. In the shown embodiment, the switch unit 150$a$ includes a switch 150$aa$ and a switch 150$ab$, provides a current provided by the current source 100$a$ to the charge accumulation means 200 using the switch 150$aa$, and provides the current provided by the current source 100a to the charge accumulation means 200' using the switch 150ab. The switch unit 150a' includes a switch 150aa' and a switch 150ab', provides a current provided by the current source 100a' to the charge accumulation means 200 using the switch 150aa', and provides the current provided by the current source 100a' to the charge accumulation means 200' using the switch 150ab'. Also, each of the switch units 150b and 150b' connected to the current sources 100b and 100b' includes a pair of switches and performs a function similar to the function of the switch unit 150a or the 150a'.

Switches included in a switch unit have a control electrode for controlling whether to electrically connect one electrode and another electrode. As an example, a switch may be implemented as a field effect transistor (FET) that has a drain electrode, a source electrode, and a gate electrode for controlling whether to electrically connect the drain electrode and the source electrode. Those of ordinary skill in the art can implement a switch and a switch unit with an N-type metal oxide semiconductor (MOS) FET (MOSFET) in which a drain and a source are electrically connected in the case of a predetermined threshold voltage or more is applied to the gate electrode and/or a P-type MOSFET in which a drain and a source are electrically connected in the case of a predetermined threshold voltage or less is applied to the gate electrode.

As another example, a switch and a switch unit can be implemented with an NPN-type bipolar junction transistor (BJT) which can adjust a current applied between an emitter electrode and a collector electrode with a current applied to a base electrode and/or a PNP-type BJT.

These examples are merely examples in which those of ordinary skill in the art easily implement a switch included in a programmable analog timing array. Those of ordinary skill in the art can implement a programmable analog timing array according to the present embodiment with a switch element having one electrode, another electrode, and a control electrode for controlling whether to electrically connect the one electrode and the other electrode such as a depletion-mode N-type MOSFET, a depletion-mode P-type MOSFET, and so on.

Figure 4:
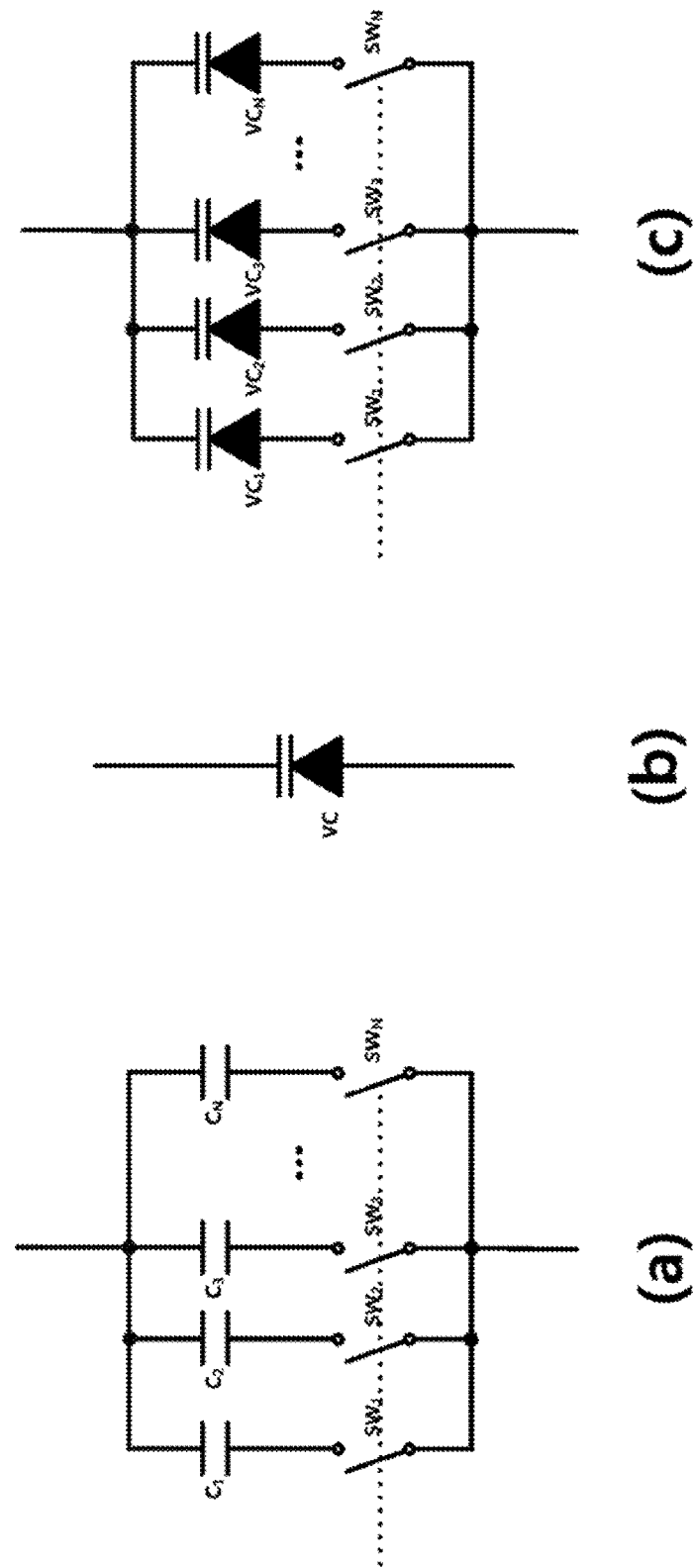
FIG. 4 shows diagrams of embodiments of a capacitor unit.

The charge accumulation means 200 accumulates charge of a current applied by a current source and outputs an electrical signal generated through the accumulation. The charge accumulation means 200 includes a capacitor unit 210 and a reset switch 220 for resetting the charge accumulation means. As an embodiment, the capacitor unit 210 includes a plurality of capacitors $C_1$, $C_2$, $C_3$, ..., and $C_N$ having a fixed capacitance and a plurality of switches $SW_1$, $SW_2$, $SW_3$, ..., and $SW_N$ as shown in FIG. 4A, and closure of the plurality of switches $SW_1$, $SW_2$, $SW_3$, ..., and $SW_N$ is controlled by a program stored in the memory 400.

Capacitor units 210 and 210' accumulate charge of a current applied by a current source, generate signals through the accumulation, and provide the generated signals to a detection means 300, 300'. When an equivalent capacitance of the capacitor units 210 and 210' controlled by the program is $C_{eq}$, a signal V(t) generated by a charge accumulation means accumulating charge is defined as shown in Expression 1 below.

$$V(t) = \frac{1}{C_{eq}} \int_0^t i \, dt \qquad \text{[Expression 1]}$$

In other words, the capacitor unit accumulates charge of the current applied by the current source and provides a voltage signal generated through the accumulation to the detection means 300. As can be seen from Expression 1 above, the electrical signal V(t) output by the detection means 300 changes over time, and the voltage signal corresponds to the equivalent capacitance $C_{eq}$ of the capacitor unit and the current i.

The memory controls one or more of the shown plurality of switches to be closed according to the stored program, so that an intended equivalent capacitance of the capacitor unit 210 is obtained. As the example shown in FIG. 4A, the plurality of capacitors $C_1$, $C_2$, $C_3$, ..., and $C_N$ included in the capacitor unit 210 may have the same capacitance. As another example, the plurality of capacitors $C_1$, $C_2$, $C_3$, ..., and $C_N$ included in the capacitor unit 210 may have different capacitances which are determined by a predetermined weighting factor.

As another embodiment of the capacitor unit 210, the capacitor unit 210 uses a voltage controlled variable capacitor VC shown in FIG. 4B. According to the present embodiment, since a capacitance of the voltage controlled variable capacitor is changed by a voltage applied between both ends thereof, the memory 400 controls the voltage applied between the both ends of the voltage controlled variable capacitor VC, so that the intended equivalent capacitance of the capacitor unit 210 is obtained.

As another embodiment of the capacitor unit, the capacitor unit 210 may include variable capacitors in which a plurality of voltage controlled variable capacitors $VC_1$, $VC_2$, $VC_3$, ..., and $VC_N$ and a plurality of switches $SW_1$, $SW_2$, $SW_3$, ..., and $SW_N$ are arranged as shown in FIG. 4C. According to the present embodiment, a program is stored in the memory to control the switches $SW_1$, $SW_2$, $SW_3$, ..., and $SW_N$ and both-end voltages of the voltage controlled variable capacitors, and the memory controls one or more of the shown plurality of switches to be closed according to the stored program and controls both-end voltages of the voltage controlled variable capacitors connected to the closed switches, so that the intended equivalent capacitance of the capacitor unit 210 is obtained.

As non-shown another embodiment of the capacitor unit, the capacitor unit may include the capacitor bank shown in FIG. 4A and the voltage controlled variable capacitor shown in FIG. 4B or 4C. When coarse tuning and fine tuning are required to match a frequency of a signal to a predetermined frequency, a capacitance control DAC 420 (see FIG. 6) included in the memory may perform coarse tuning by controlling whether to close the switches $SW_1$, $SW_2$, $SW_3$, ..., and $SW_N$ included in the capacitor bank, perform fine tuning by controlling a voltage applied to the voltage controlled variable capacitors, and thereby perform frequency matching.

Referring back to FIGS. 1 and 2, when reset switches 220 and 220' are closed, charge accumulated in the capacitor units is discharged to reset the charge accumulation means 200 and 200'. As an embodiment, reset switches may be switches that are controlled by detection signals OUT and OUT' of detection means as shown in FIGS. 1 and 2. Also, when the reset switches 220 and 220' are closed, currents provided by the current sources are bypassed to a reference potential. Therefore, the capacitor units 210 and 210' cannot accumulate charge and thus cannot generate voltage signals.

For example, the reset switches may be implemented with an element in which whether one electrode and another electrode are electrically connected is controlled by an electrical signal applied to a control electrode, such as a FET, a BJT, etc., like switches included in the above-described switch units 150a, 150b, 150a', and 150b'.

Figure 5:
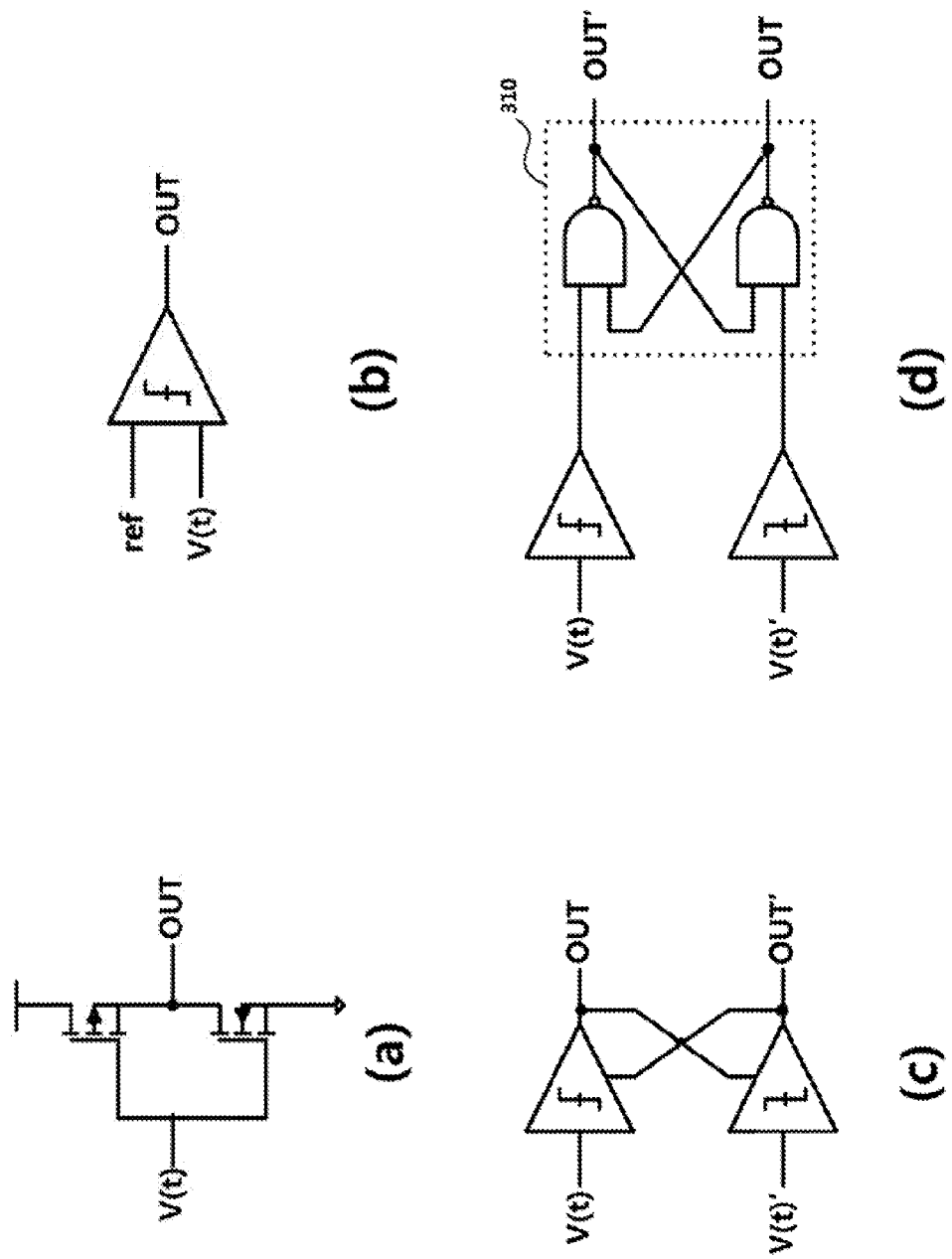
FIG. 5 shows diagrams of implementation examples of a detection means.

The detection means 300 and 300' detect electrical signals provided by the above-described charge accumulation means and generate and output detection result signals according to relations with a threshold value. In an embodiment, the detection means 300 and 300' may be inverters having a predetermined threshold voltage as shown in FIG. 5A. When the electrical signal V(t) reaches the threshold voltage, an N-channel MOS (NMOS) transistor becomes conductive, and a common voltage is output as an output signal OUT. On the other hand, when the electrical signal V(t) is equal to or less than the threshold voltage, a P-channel MOS (PMOS) transistor becomes conductive, and a supply voltage Vdd is output as the output signal OUT.

As another embodiment, the detection means may be a comparator that compares a predetermined threshold value ref and the input electrical signal V(t) as shown in FIG. 5B. In other words, when the electrical signal V(t) is applied to the detection means, the detection means compares the electrical signal V(t) with the threshold value and outputs the output signal OUT according to whether the electrical signal V(t) is equal to or greater than the threshold value.

As non-shown other embodiments, the detection means may be implemented as a Schmitt trigger circuit, and a circuit that compares an input signal with a predetermined or programmable threshold value and outputs a signal according to a comparison result may be used as the detection means of the present embodiment.

FIGS. 5C and 5D are examples of detection means implemented in an embodiment including a pair of analog timing arrays. When there are a pair of programmable analog timing arrays, each of the programmable analog timing arrays may be required to maintain a complementary output. In the embodiment shown in FIG. 5C, detection means may be configured to cross-feedback signals output by themselves to each other, so that the detection means may output detection signals complementary to each other.

In the embodiment shown in FIG. 5D, the detection means 300 and 300' have a latch circuit 310 that receives and latches signals output from the detection means, so that signals complementary to each other may be output.

In the embodiment shown in FIG. 5C or 5D, detection signals OUT and OUT' should be complementary to each other, that is, when any one signal is logic 1, the other signal is logic 0. However, when no initial value is set and the current sources 100a and 100a' or the current sources 100b and 100b' apply the same current to the capacitor units 210 and 210' having the same equivalent capacitance, both the charge accumulation means 300 and 300' output the same detection signal, so that the complementarity of the output signals may be lost. To solve this problem, when the programmable analog timing arrays are initially operated or require resetting, a reset signal may be applied to initially set the outputs of the detection means to be complementary to each other. For example, the reset signal may be provided from the outside of the programmable analog timing arrays and/or the memory 400.

When the complementary outputs are set by the reset signal, the reset switches 220 and 220' that reset the capacitor units 210 and 210' also operate complementarily due to the complementary outputs. Therefore, even when the current sources apply the same current, the capacitor units 210 and 210' provide output signals which are complementary to each other due to the reset switches 220 and 220' which operate complementarily to each other, so that the outputs of the detection means 300, 300' also may maintain complementarity.

Figure 6:
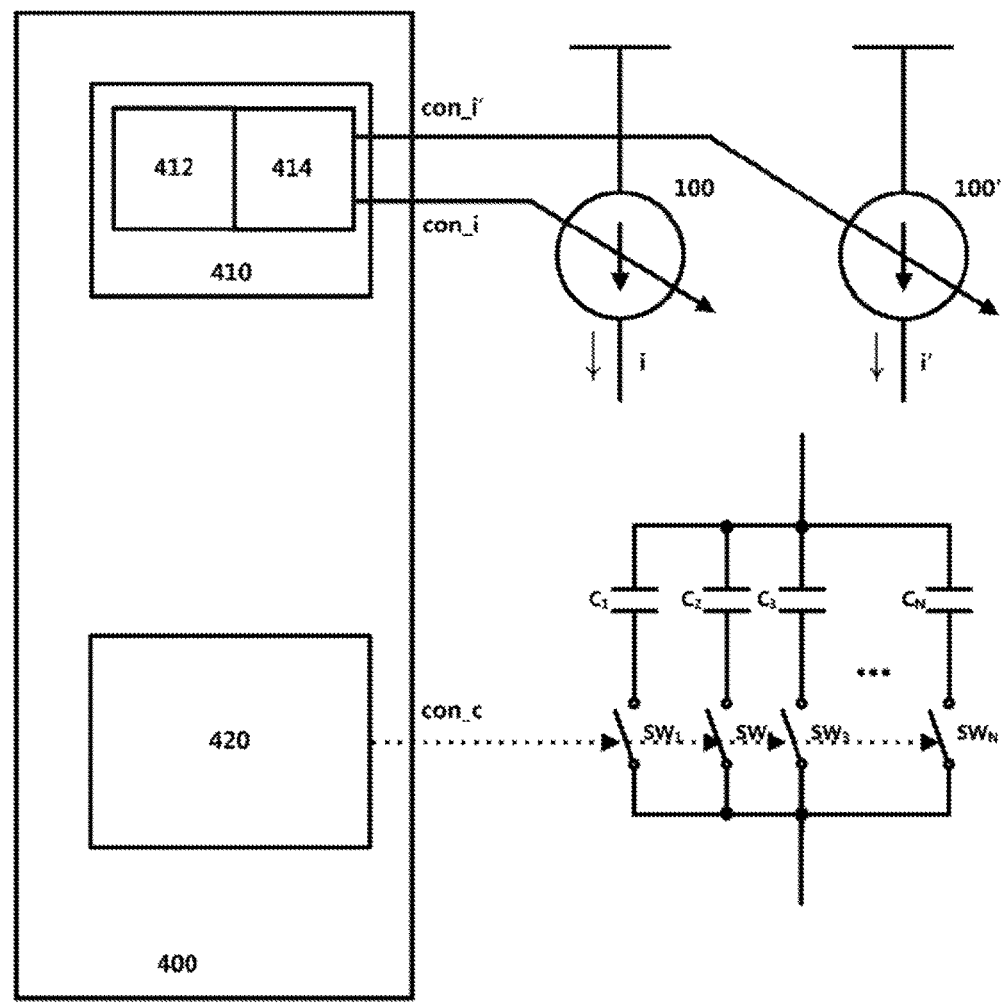
FIG. 6 is a diagram showing an embodiment of a memory and current sources included in programmable analog timing arrays that operate in pairs.

Referring to FIGS. 1, 2, and 6, the memory 400 receives a program from a user and stores the program. Further, while the programmable analog timing array operates, the memory 400 may receive a signal from a field-programmable digital block 2000 (see FIG. 7), a custom cell block, another field-programmable analog array 1000 (see FIG. 7), and the outside of a chip, store the signal, and control the circuit according to the stored signal. In this way, information of a signal applied during operation of the programmable analog timing array can be stored in the memory, and the programmable analog timing array can be controlled in real time by the stored signal.

In the present specification, the memory stores not only a program received from a user but also a signal applied from a field-programmable digital block, a custom cell block, another field-programmable analog array, and/or the outside of the chip during operation of a programmable analog timing array, and the programmable analog timing array according to the present embodiment may be controlled by the signal, like the program received from the user. Therefore, both the signal and the program are defined as "program."

A program may include a code for controlling whether to close a switch included in a capacitor unit, a code for controlling a both-end voltage of a capacitor to obtain an intended capacitance, and a code for controlling a current source as described above. The memory 400 includes the DAC 410 which generates the control signals con_i and con_i' for controlling currents of the current sources from a program, and the capacitance control DAC 420 which generates a control signal con_c for controlling an equivalent capacitance of a capacitor unit from the program.

When the programmable analog timing array according to an embodiment of the present invention operates in a single-ended fashion, the current control DAC 410 included in the memory receives a code for controlling the current source from the memory 400, decodes the code, and generates the control signal con_i corresponding to the code. As described above, the variable current source 100 is controlled by the control signal provided by the DAC 110 and provides a current i corresponding to the control signal.

FIG. 6 is a diagram showing an embodiment of the memory 400 and the current sources 100 and 100' included in programmable analog timing arrays that operate in pairs. Referring to FIGS. 3 and 6, the memory provides a code for controlling a current source to a coarse tuning DAC 412 and a fine tuning DAC 414. The coarse tuning DAC 412 calculates a highest value of a current that can be applied by a current source from the provided code, and the fine tuning DAC 414 adjusts a ratio of currents applied by current sources which operate complementarily to each other to correspond to the code.

For example, when the current sources which operate complementarily to each other apply a highest current of 100 mA and are programmed to output currents at a ratio of 2:8 and the program is stored in the memory, the coarse tuning DAC 412 generates a control signal so that a current source may provide a highest current of 100 mA, and the fine tuning DAC 414 makes detailed adjustments so that the current sources may apply 20 mA and 80 mA.

The capacitance control DAC 420 included in the memory receives a code for controlling a capacitor unit from the memory 400, decodes the code, and generates the control signal con_c corresponding to the code. The capacitor unit is controlled by the control signal provided by the capacitance control DAC 420 and forms an equivalent capacitance corresponding to the control signal. As an example, the capacitance control DAC may control the equivalent capacitance of the capacitor unit by controlling closure of the switches $SW_1$, $SW_2$, $SW_3$, ..., and $SW_N$ included in the capacitor unit as shown in the drawing. As non-shown another example, the capacitance control DAC 420 may form the equivalent capacitance of the capacitor unit by generating a voltage applied to a voltage controlled capacitor included in the capacitor unit according to a program. As non-shown another example, the capacitance control DAC 420 may control the equivalent capacitance of the capacitor unit by controlling closure of the switches $SW_1$, $SW_2$, $SW_3$, ..., and $SW_N$ included in the capacitor unit in the coarse tuning step, and form the equivalent capacitance of the capacitor unit by generating a voltage applied to a voltage controlled capacitor included in the capacitor unit in the fine tuning step.

Figure 7:
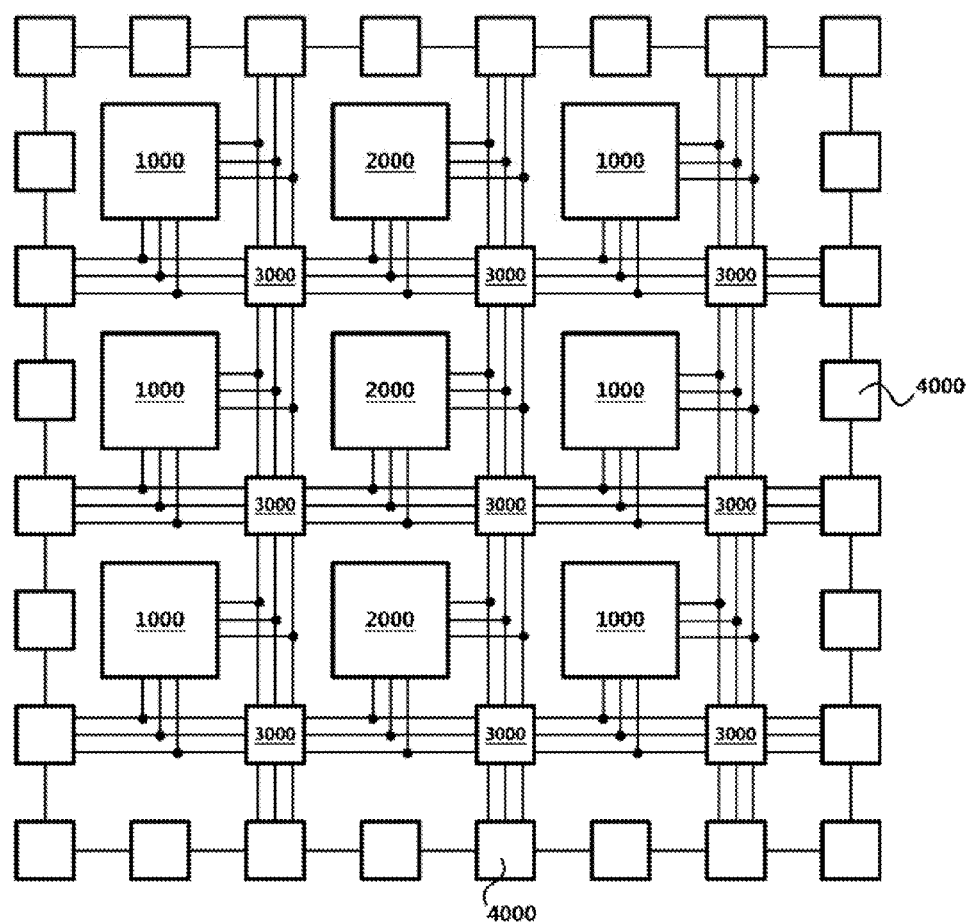
FIG. 7 is a diagram showing an outline of a programmable analog timing array according to the present embodiment.

A field-programmable mixed signal array according to an embodiment of the present invention will be described below with reference to FIG. 7. However, for simple and clear description, description of a duplicated part with the above-described embodiment may be omitted. The field-programmable mixed signal array according to the present embodiment includes input/output (I/O) pads 4000 which receive a signal from the outside of a chip or provide a signal to the outside of the chip, field-programmable analog arrays 1000 which include programmable analog timing arrays, field-programmable digital blocks 2000, and field-programmable connecting wire blocks 3000 which route input and output signals of the field-programmable analog arrays 1000 and the field-programmable digital blocks 2000 and signals provided to or by the I/O pads according to a program.

At least one programmable analog timing array is arranged in the form of an array/matrix to form a field-programmable analog array 1000. FIG. 7 shows only an embodiment in which a column of field-programmable analog arrays 1000 and one column of field-programmable digital blocks 2000 are alternately arranged, but field-programmable analog arrays 1000 and field-programmable digital blocks 2000 may be arranged in a lattice shape with respect to each other.

The field-programmable digital blocks 2000 are synthesized by a program provided by a user to perform a function intended by the user, like an existing field-programmable gate array (FPGA). The user describes the intended function in a hardware description language (HDL), such as very-high-speed integrated circuits (VHSIC) HDL (VHDL), Verilog, so on, and an FPGA chip performs the function described in the HDL.

When the user describes a digital calculation function to be implemented, the field-programmable digital blocks 2000 according to the present embodiment are synthesized to perform the described function, like an existing FPGA. For example, the field-programmable digital blocks 2000 may perform functions of an arithmetic-logic unit (ALU), a register, a counter, a multiplexer, a demultiplexer, a decoder, etc. according to a program provided by a user.

The I/O pads 4000 provide a signal applied to the chip into the chip or provides a signal provided by the chip to the outside of the chip. The I/O pads 4000 are bonded with wires and electrically connected to a lead or a bump of the chip. For example, data, such as a program, etc., provided by a user to the field-programmable analog arrays 1000 or the field-programmable digital blocks 2000 is provided through the I/O pads, and data calculated by the field-programmable mixed signal array according to the present embodiment is also provided to the outside of the chip through the I/O pads.

The field-programmable connecting wire blocks 3000 route signals provided by the I/O pads 4000, the field-programmable digital blocks 2000, and the field-programmable analog arrays 1000. The field-programmable connecting wire blocks include routing traces and switches which electrically connect or disconnect the routing traces, and connections thereof are controlled by a program. To facilitate illustration, identification marks are added to switches disposed at points where the routing traces cross, but the routing traces are also included in the field-programmable connecting wire blocks controlled by a program as described above. For example, each block is shown to be connected with three routing traces. However, this is only an example, and each block may be connected with three or more traces or three or less traces.

Since signal wirings of the field-programmable connecting wire blocks are controlled by a program, connections between the field-programmable analog arrays, the field-programmable digital blocks, and/or custom cell blocks are adjusted so that a field-programmable analog array according to the present embodiment may perform various functions as an oscillator, a phase shifter, a direct current (DC)-DC converter, a phase-locked loop (PLL), and so on.

In an embodiment, the field-programmable mixed signal array may include a custom cell block which has a circuit previously implemented to perform a particular function. For example, when a function can be implemented by a field-programmable digital block but it is required to operate at higher speed than an operation speed implemented with a field-programmable digital block, or it is required to convert a general analog voltage signal, etc. into a form that is acceptable by a programmable analog timing array according to the present embodiment, a circuit may be previously implemented to perform an intended function and disposed in a custom cell. For example, a phase detector, a phase frequency detector, a voltage-time converter (VTC) that converts an analog voltage input into a pulse form, etc. may be implemented and arranged in the custom cell block.

The field-programmable mixed signal array having such a configuration receives a program to perform a particular function and performs the intended function. Embodiments of a relaxation oscillator (RO), a time-digital converter (TDC), a phase shifter, a phase interpolator (PI), a digital pulse width modulator (DPWM), a DC-DC converter, and a PLL implemented with the field-programmable mixed signal array according to the present embodiment will be described below with reference to the accompanying drawings.

Embodiments to be described below are implemented by programming a field-programmable analog array including a programmable analog timing array, a field-programmable digital block, and a field-programmable connecting wire block. Therefore, there is an advantage in that a user can provide a program in the field and control the field-programmable mixed signal array according to the present embodiment to perform a function intended by the user as an oscillator, a TDC, a phase shifter, or so on, and it is possible to control a circuit in real time using a signal which is provided by the circuit during operation and received and stored in a memory.

The following descriptions are intended for clear disclosure of a field-programmable mixed signal array, a field-programmable analog array, and a programmable analog timing array according to the present embodiment and do not limit the scope of the present invention. Also, embodiments to be described below correspond to a very few of functions that can be implemented using the field-programmable mixed signal array, the field-programmable analog array, and the programmable analog timing array according to the present embodiment, and the field-programmable mixed signal array, the field-programmable analog array, and the programmable analog timing array according to the present invention may be implemented to perform not only functions of described implementation examples but also various undescribed functions according to a program.

Figure 8:
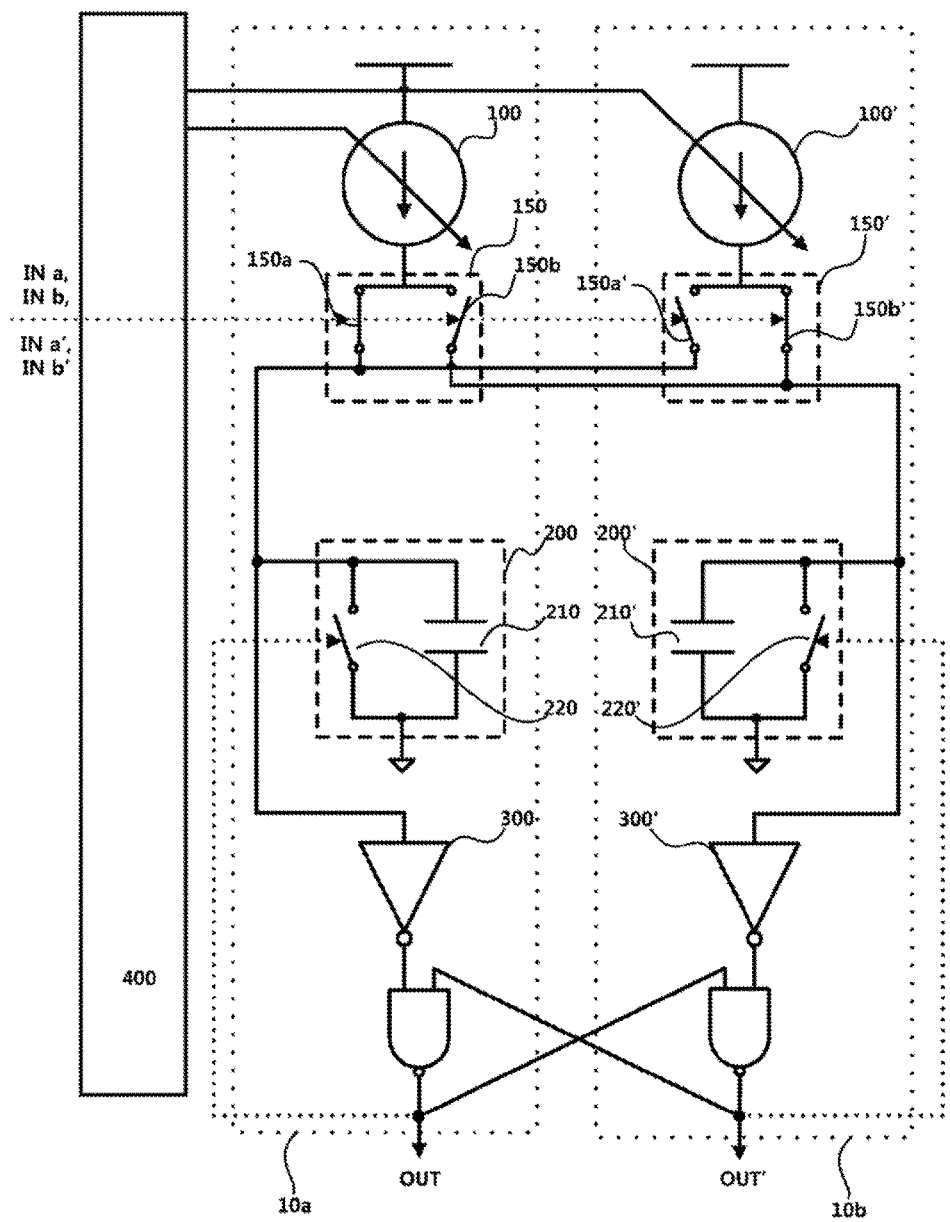
FIG. 8 is a diagram of a relaxation oscillator (RO) implemented with programmable analog timing arrays according to the present embodiment.
Figure 9:
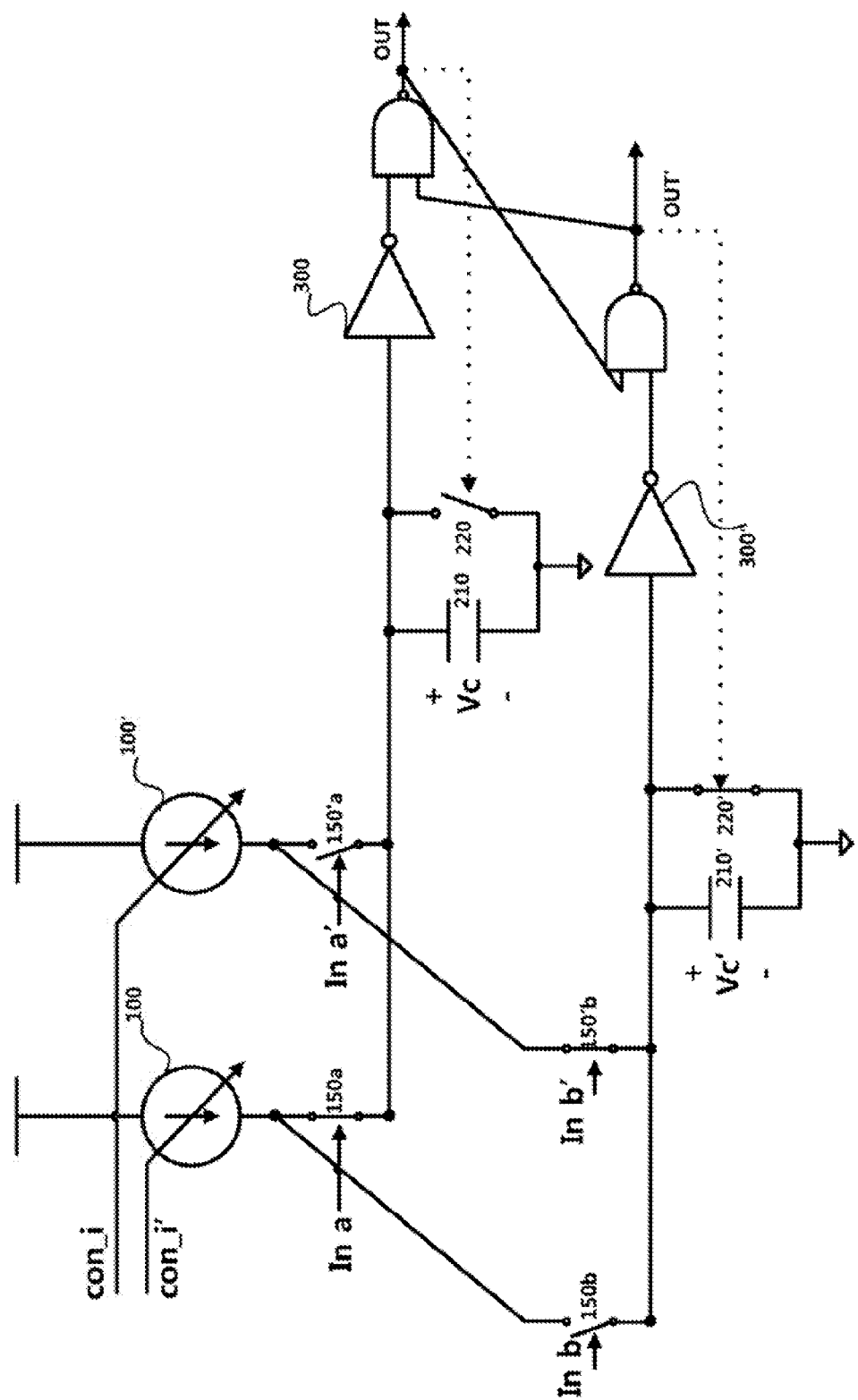
FIG. 9 is a schematic equivalent circuit diagram of the RO shown in FIG. 8.

FIG. 8 is a diagram of an RO implemented with programmable analog timing arrays according to the present embodiment, and FIG. 9 is a schematic equivalent circuit diagram of the RO shown in FIG. 8. FIGS. 10(A) to 10(C) are schematic timing diagrams of the RO.

Figure 10:
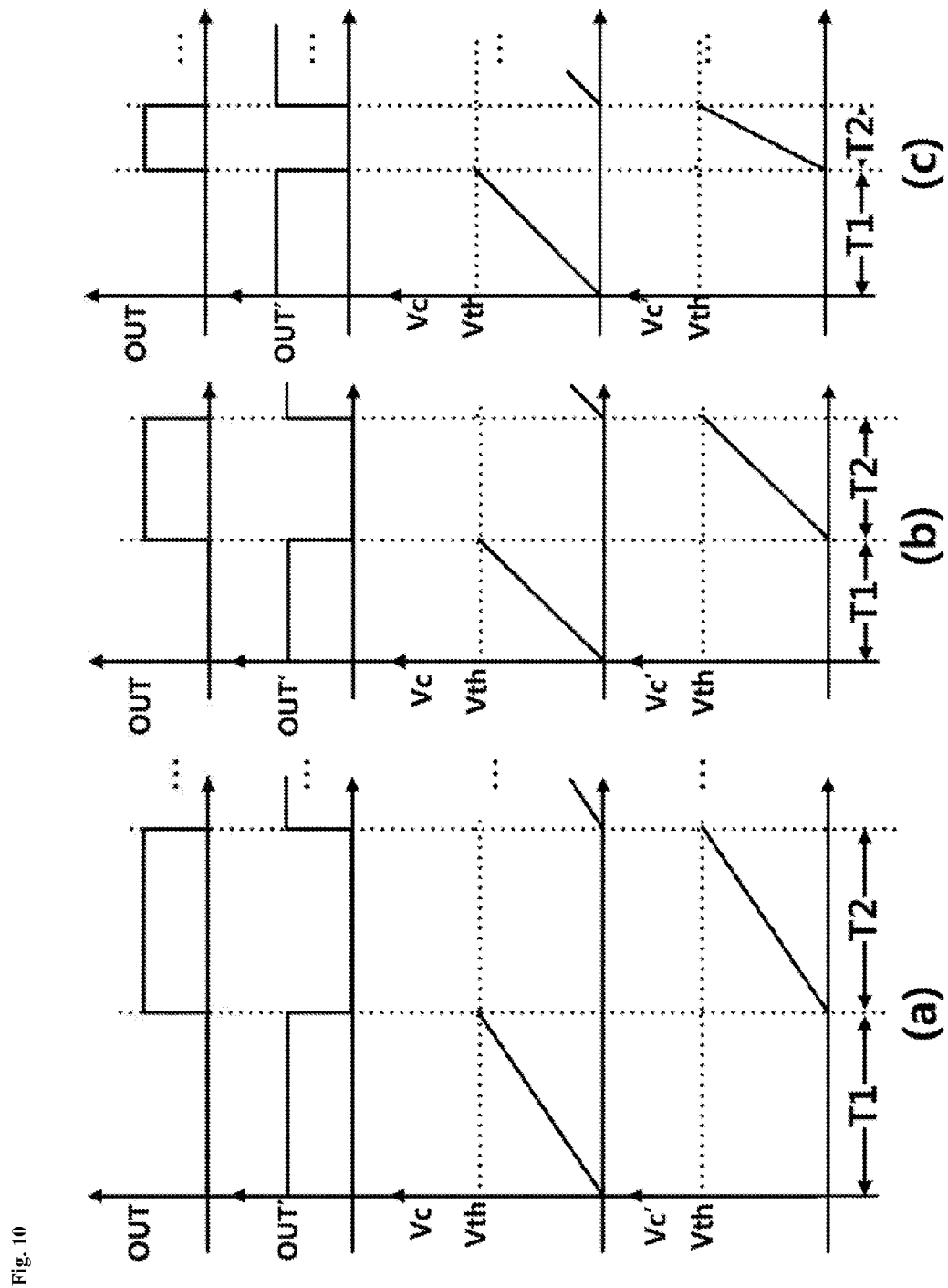
FIG. 10 illustrates schematic timing diagrams of the RO.

Referring to FIGS. 8 to 10, the RO includes a pair of programmable analog timing arrays 10a and 10b that output complementary values. Each of current sources 100 and 100' receives a control signal from the DAC 410 (see FIG. 3), the coarse tuning DAC 412 (see FIG. 6), and the fine tuning DAC 414 (see FIG. 6) included in the memory storing a program and applies an intended current. Although not shown in FIGS. 8 and 9, it is possible to apply a higher current by closing the pair of switches 150b and 150b' shown in FIG. 2 as necessary. Also, as will be described below, it is possible to adjust a duty ratio of a signal output by the RO by differently adjusting values of currents provided by the current sources 100 and 100'.

When it is intended to operate the programmable analog timing arrays according to the present embodiment as an RO, signals IN a and IN b' for controlling whether to close switches 150a and 150b' are applied to the switches 150a and 150b', so that the switches 150a and 150b' may be controlled to be closed, and signals In b and In a' for controlling whether to close switches 150b and 150a' are applied to the switches 150b and 150a', so that the switches 150b and 150a' may be controlled to be opened. Therefore, the switches 150a and 150b' are closed, and the currents provided by the current sources 100 and 100' are applied to capacitor units 210 and 210', respectively. The input signals In a, In a', In b, In b' for controlling the switches are provided by a field-programmable digital block or the outside of a chip, connected by a field-programmable connecting wire block, and provided to the programmable analog timing arrays.

As shown in the drawings, detection means 300 and 300' may be implemented as, for example, inverters having a predetermined threshold value, and latches may be further included to ensure the complementarity of output values. Also, as described above, detection signals OUT and OUT' output by the detection means are set to be complementary to each other by applying a reset signal at the initial stage of operation.

In the following embodiment, unless described otherwise, it is assumed that a detection signal of logic 1 is output when signals output by charge accumulation means 200 and 200' accumulating charge reach a threshold value, and a detection signal of logic 0 is output when the signals are less than the threshold value. An example in which the outputs OUT and OUT' of the detection means are respectively set to logic 0 and logic 1 by the reset signal and reset switches 220 and 220' are implemented as switches closed by a signal of logic 1 and opened by a signal of logic 0 is assumed. However, this is intended to specify and describe any one of various implementable embodiments for simple and clear description and is not intended to limit the scope of the present invention. Also, it is self-evident that those of ordinary skill in the art to which the present embodiment pertains can modify the embodiment by replacing the switches with switches closed by a signal of logic 0 and opened by a signal of logic 1 or by replacing an SR latch implemented with NAND gates with an SR latch implemented with NOR gates.

During a period T1 shown in FIG. 10A, as shown in FIG. 9, the reset switch 220' is closed by the reset signal at the initial stage of operation of the programmable analog timing arrays, so that a current applied by the current source 100a' flows to a reference potential. On the other hand, the reset switch 220 is opened, and a current applied by the current source 100 is applied to the capacitor unit 210 included in the charge accumulation means, so that a predetermined voltage signal Vc is generated by charge accumulation.

Equivalent capacitances of the capacitor units 210 and 210' are controlled by a program, and a timing of a voltage output by a capacitor unit in a programmable analog timing array can be adjusted by adjusting an equivalent capacitance together with a current applied by a current source.

The detection means 300 and 300' compare magnitudes of voltage signals output by the capacitor units accumulating a predetermined amount of charge with a threshold value Vth and output the predetermined detection signals OUT and OUT'.

When both voltages Vc and Vc' output by the charge accumulation means are equal to or less than the threshold value Vth, both the detection means implemented with inverters output logic 1. When only inputs of logic 1 are applied to the SR latch implemented with NAND gates, the complementarity of outputs is not lost, and previous outputs are maintained as they are. Therefore, even when the output signal Vc of the capacitor unit 210 in which a current is accumulated is equal to or less than the threshold value, the latch maintains previous outputs.

Unlike a capacitor unit in which a switch is closed and no charge has been accumulated, any one capacitor unit that has accumulated sufficient charge of a current applied by a current source outputs a voltage of the threshold value or more, and a detection means that senses the voltage outputs a detection signal corresponding to the voltage. For example, as shown in the embodiment of FIGS. 8 to 10, the capacitor unit 210 in which sufficient charge has been accumulated outputs a voltage signal of the threshold value Vth or more, but the capacitor unit 210' in which the switch 220' has been closed and no change is accumulated outputs no voltage signal or only a voltage signal less than the threshold value. When the voltage signal output by the capacitor unit 210 is equal to or greater than the threshold value, the detection means 300 implemented with an inverter provides a signal of logic 0 to the latch. The latch toggles a previous output signal and outputs logic 1 as the detection signal OUT, and on the contrary, the detection means 300' outputs logic 0 as the detection signal OUT'.

The reset switch 220 is closed by the toggled detection signal OUT and discharges charge accumulated in the capacitor unit 210, and the current applied from the current source 100a likewise flows to the reference potential. However, the reset switch 220' is opened by the toggled detection signal OUT', and accordingly the current applied from the current source 100a' is accumulated in the capacitor unit 210'. As shown in a period T2 of FIG. 10A, charge is accumulated, and the voltage Vc' is output. The capacitor unit 210 cannot accumulate charge and thus outputs no voltage signal or only a voltage signal less than the threshold value. Therefore, both the detection means 300 and 300' output logic 1. Consequently, before an output of a capacitor unit becomes the threshold value or more, the complementarity of latch outputs is not lost, and previous outputs are maintained as they are. In the RO according to the present embodiment, the programmable analog timing arrays 10a and 10b alternately and continuously operate, and accordingly the outputs OUT and OUT' complementarily alternate.

Frequencies of the outputs OUT and OUT' of the RO may be controlled by controlling a current applied by a current source. In other words, when the current sources 100 and 100' are controlled to apply currents higher than the currents of the embodiment shown in FIG. 10A or the current sources 100b and 100b' (see FIG. 2) apply currents together with the current sources 100 and 100', a rate at which charge is accumulated in the same capacitor and generates a voltage increases as shown in FIG. 10B, and accordingly the frequencies of the output signals output by the RO increases.

Also, the currents applied by the current sources 100 and 100' may be programmed to differ from each other, so that duty ratios of the output signals OUT and OUT' may be adjusted. For example, assuming that the current applied by the current source 100' is higher than the current applied by the current source 100, as shown in FIG. 10C, a time in which the voltage Vc' generated by accumulating the current applied by the current source 100' reaches the threshold value is shorter than a time in which the voltage Vc generated by accumulating the current applied by the current source 100 reaches the threshold value. Therefore, the DAC 414 controls a ratio of the currents applied by the current sources 100a and 100a', so that the duty ratios of the signals output by the RO can be controlled.

Although not shown in the drawings, it is self-evident that the frequencies and the duty ratios of the signals output by the RO can be controlled by controlling the equivalent capacitances of the capacitor units.

In the present embodiment, switches that are closed by a signal of logic 1 exemplify the reset switches 220 and 220', but on the contrary, the reset switches 220 and 220' may be implemented with switches that are closed by a signal of logic 0, that is, N-type FET switches, P-type FET switches, NPN junction transistors, PNP junction transistors, etc., as described above. Also, an example in which the detection means 300 and 300' are implemented with inverters has been described for convenience of understanding, but it is self-evident that the detection means 300 and 300' can be implemented with buffers, comparators, Schmitt triggers, etc. as described above. Although an SR latch implemented with NAND gates is applied to the present embodiment, it is self-evident that an SR latch implemented with NOR gates, a JK latch, and a gated latch can be used.

In programmable analog timing arrays according to an embodiment of the present invention, currents applied by current sources and equivalent capacitances of charge accumulation means are controlled by a program which is provided by a user and stored or which is obtained by storing a signal applied during a circuit operation, so that frequencies and duty ratios of signals output by an oscillator can be controlled.

Figure 11:
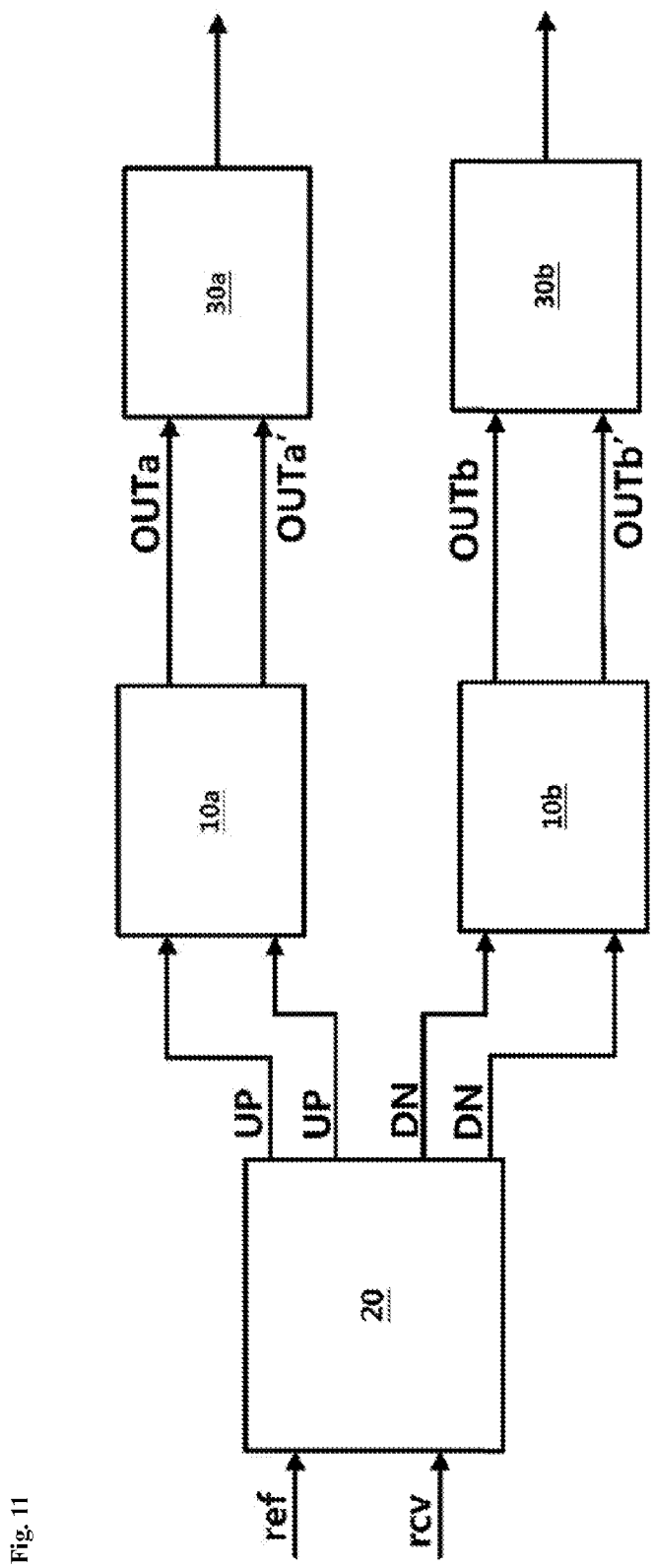
FIG. 11 is a block diagram showing an outline of a time-digital converter (TDC) implemented with programmable analog timing arrays according to the present embodiment.
Figure 12:
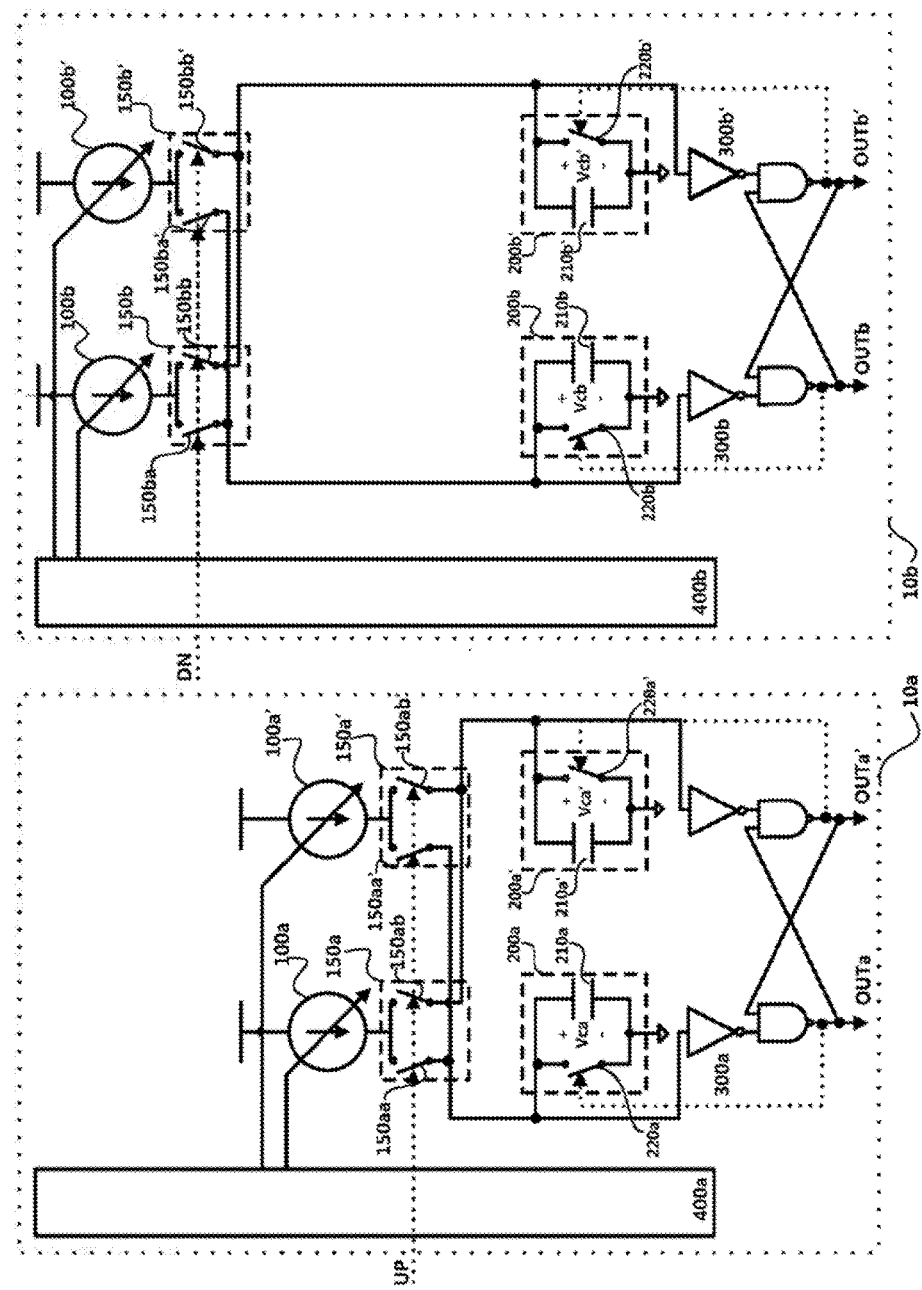
FIG. 12 is a schematic equivalent circuit diagram of the TDC shown in FIG. 11.
Figure 13:
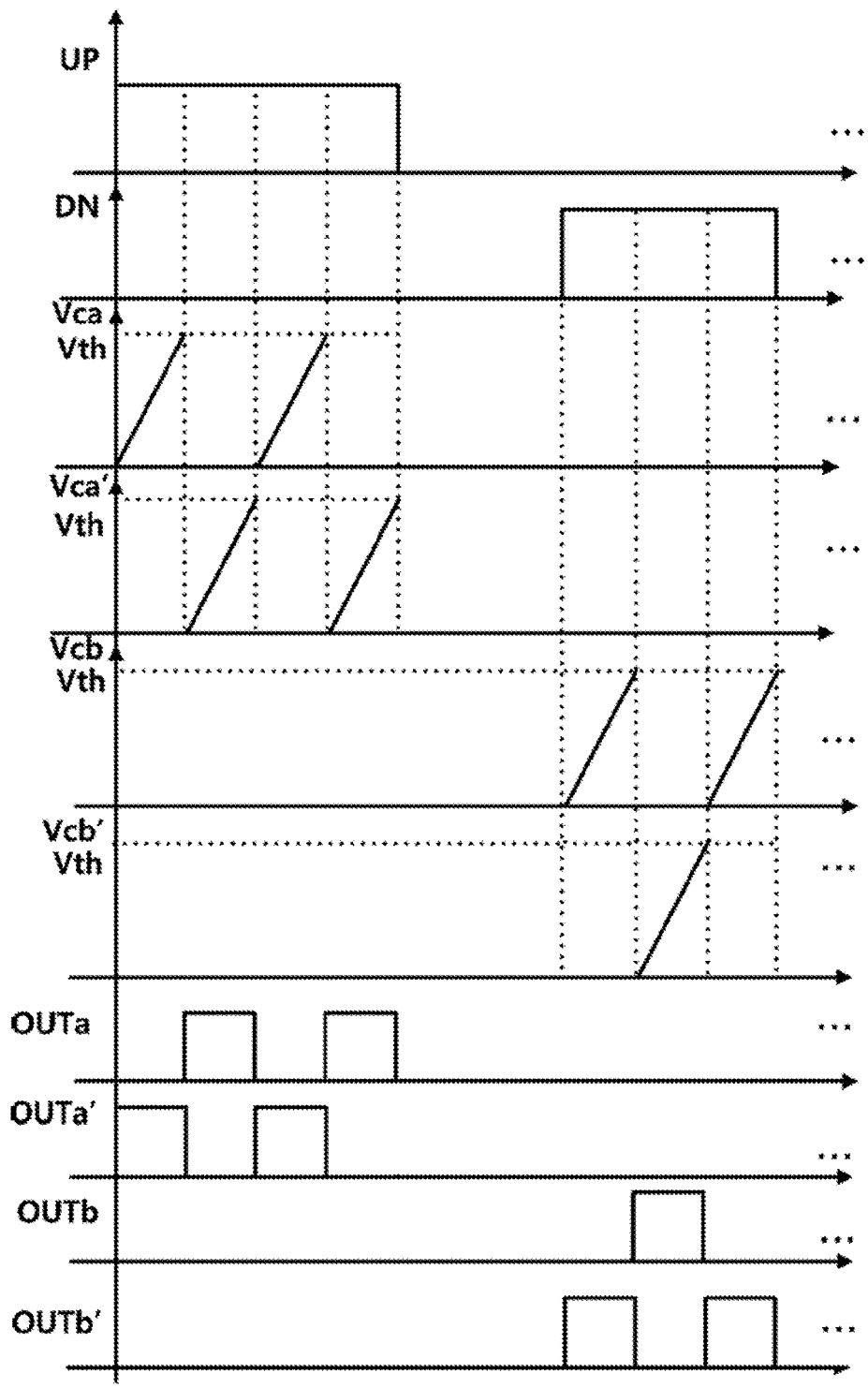
FIG. 13 is a timing diagram of the TDC according to the present embodiment.

FIG. 11 is a block diagram showing an outline of a TDC implemented with programmable analog timing arrays according to the present embodiment, and FIG. 12 is a schematic equivalent circuit diagram of the TDC shown in FIG. 11. FIG. 13 is a timing diagram of the TDC according to the present embodiment. Referring to FIGS. 11 to 13, the TDC according to the present embodiment includes a phase frequency detector (PFD) 20, programmable analog timing arrays 10a and 10b, and counters 30a and 30b. For simple and clear description, description of a duplicated part with the above-described embodiment may be omitted.

Referring to FIGS. 11 to 13, in the present embodiment, current sources 100a, 100a', 100b, and 100b' included in the programmable analog timing arrays are controlled by a program and provide the same current. The PFD 20 receives a reference signal ref and an input signal rcv and outputs an up signal UP and a down signal DN which are error signals having a pulse width corresponding to a phase difference between the reference signal ref and the input signal rcv. When a phase of the input signal rcv lags behind a phase of the reference signal ref, the PFD 20 outputs the up signal UP having a pulse width which is proportional to the phase difference, and when the phase of the input signal rcv precedes the phase of the reference signal, the PFD 20 outputs the down signal DN having a pulse width corresponding to the phase difference.

As an implementation example of the PFD 20, a circuit may be previously implemented to perform an intended function and disposed in a custom cell block. As another implementation example, the PFD 20 may be implemented as a field-programmable digital block which is synthesized by a user describing a function in an HDL. The reference signal ref and the input signal rcv input to the PFD are routed by a field-programmable connecting wire block and electrically connected to the PFD 20, and the up signal UP and the down signal DN output by the PFD 20 are provided to the pair of analog timing arrays 10a and 10b likewise by the field-programmable connecting wire block 3000. Further, output signals OUTa, OUTa', OUTb, and OUTb' of the programmable analog timing arrays 10a and 10b are likewise routed by the field-programmable connecting wire block and electrically connected to the counters 30a and 30b.

The up signal UP and the down signal DN output by the PFD 20 are separately input to the different programmable analog timing arrays. In an embodiment, as shown in FIG. 12, the up signal UP is provided to the programmable analog timing array 10a, applied to a switch 150aa so that a current provided by the current source 100a may be provided to a capacitor unit 210a or blocked, and applied to a switch 150ab' so that a current provided by the current source 100a' may be provided to a capacitor unit 210a' or blocked. Also, the down signal DN is provided to the programmable analog timing array 10b, applied to a switch 150ba so that a current provided by the current source 100b may be provided to a capacitor unit 210b or blocked, and applied to a switch 150bb' so that a current provided by the current source 100b' may be provided to a capacitor unit 210b' or blocked.

Therefore, in the programmable analog timing array 10a to which the up signal UP is applied, the switches 150aa and 150ab' are controlled by the up signal, and the current sources 100a and 100a' apply the same current to the capacitor units 210a and 210a'. Likewise, in the programmable analog timing array 10b to which the down signal DN is applied, the switches 150ba and 150bb' are controlled by the down signal, and the current sources 100b and 100b' apply the same current to the capacitor units 210b and 210b'. In the programmable analog timing array 10a, the switches 150ab and 150aa' are controlled to be opened, and in the programmable analog timing array 10b, the switches 150bb and 150ba' are controlled to be opened.

At an initial stage of operation of the programmable analog timing array, a reset signal initially sets the outputs OUTa and OUTa' of a latch to states complementary to each other. For example, the outputs OUTa and OUTa' of the latch are set to logic 0 and logic 1, respectively. Therefore, a reset switch 220a' is closed, but a reset switch 220a is opened. When the up signal UP having a pulse width corresponding to a phase difference between the reference signal ref and the input signal rcv is applied to the switches 150a and 150a', the current applied by the current source 100a' flows to a reference potential due to the closed reset switch 220a'. However, since the reset switch 220a is opened, the capacitor unit 210a accumulates charge of the current applied by the current source 100a and generates a voltage signal Vc.

As described above, even when both the signals output by the capacitor units 210a and 210a' are equal to or less than a threshold value, both the detection means 300a and 300a' configured as inverters output logic 1, but the SR latch to which the outputs are input maintains previous outputs as they are.

Since the reset switch 220a' has been closed, the capacitor unit 210a' cannot accumulate charge. Therefore, the capacitor unit 210a' has no output voltage or generates and outputs only a low voltage equal to or less than the threshold value. However, when the capacitor unit 210a accumulates charge and outputs a voltage equal to or greater than the threshold value, latch outputs are toggled, and the latch outputs logic 1 and logic 0 as OUTa and OUTa', respectively. Accordingly, the opened reset switch 220a is closed, and the closed reset switch 220a' is opened, so that the capacitor unit 210a' accumulates charge. Likewise, when a voltage Vca' generated by the capacitor unit 210a' accumulating charge rises to the threshold value or more, the latch outputs OUTa and OUTa' are toggled again, and logic 0 and logic 1 are output as OUTa and OUTa', respectively. When the up signal UP is continuously applied, the latch outputs OUTa and OUTa' are toggled between logic 1 and logic 0 and form pulse trains.

When the phase of the input signal rcv applied to the PFD 20 precedes the phase of the reference signal ref, the PFD generates and applies the down signal DN to the switches 150b and 150b' of the programmable analog timing array 10b. Therefore, the current source 100b applies the current to the capacitor unit 210b included in the charge accumulation means 200b, and the current source 100b' applies the current to the capacitor unit 210b' included in the charge accumulation means 200b'.

For example, when the latch outputs OUTb and OUTb' are initially set by the reset signal to logic 0 and logic 1 respectively, the reset switch 210b' is closed by the signal OUTb' and allows the current applied by the current source 100b' to flow to the reference potential. However, the reset switch 210b is opened, and the capacitor unit 210b included in the charge accumulation means 200b accumulates charge of the current applied by the current source 100b and generates a voltage signal. When the voltage signal is generated at the threshold value or more, the latch outputs OUTb and OUTb' are respectively toggled to logic 0 and logic 1, which has been described above.

As described above, when the up signal UP is applied, the programmable analog timing array 10a forms pulse trains of OUTa and OUTa' having the pulse width corresponding to the pulse width of the up signal and outputs the pulse trains. Likewise, when the down signal DN is applied, the programmable analog timing array 10b forms pulse trains of OUTb and OUTb' having the pulse width of the down signal and outputs the pulse trains.

Therefore, as shown in FIG. 11, the counters may be used to count the numbers of pulses of OUTa and OUTa' and pulses of OUTb and OUTb' output by the programmable analog timing array 10a and to find a phase difference between the input signal rcv and the reference signal ref.

The counter 30 may be implemented in the field-programmable digital block, and are preferably implemented as counters capable of solving a signal glitch problem, for example, grey counters. However, when the counters 30a and 30b are implemented as grey counters, a count result should be converted with a grey decoder (not shown). The grey decoder can be implemented with the field-programmable digital block which has been synthesized above by the user describing the function in the HDL. As another example of the grey counters and the grey decoder, a circuit previously disposed in the custom cell block may be used.

During operation of the TDC according to the present embodiment, a capacitor unit may not be reset, and a voltage may be maintained without reaching a threshold value. In this case, charge previously accumulated in the capacitor unit is maintained, and a left error value may remain until a next operation period.

While a value which has been left due to a quantization error is lost in an existing TDC, accumulated charge is maintained in the TDC according to the present embodiment and thus it is possible to remove the influence of a quantization error during a long operation period.

When an up signal and a down signal which are outputs of a PFD are programmed to be routed to switches of programmable analog timing arrays by a field-programmable connecting wire block, current sources generate the same current, and equivalent capacitances of capacitor units are programmed to be identical and stored in a memory, it is possible to see that the programmable analog timing arrays operate as a TDC. Further, a timing of an analog circuit can be changed and adjusted by simply controlling a current applied by a current source and a capacitance with a program.

Figure 14:
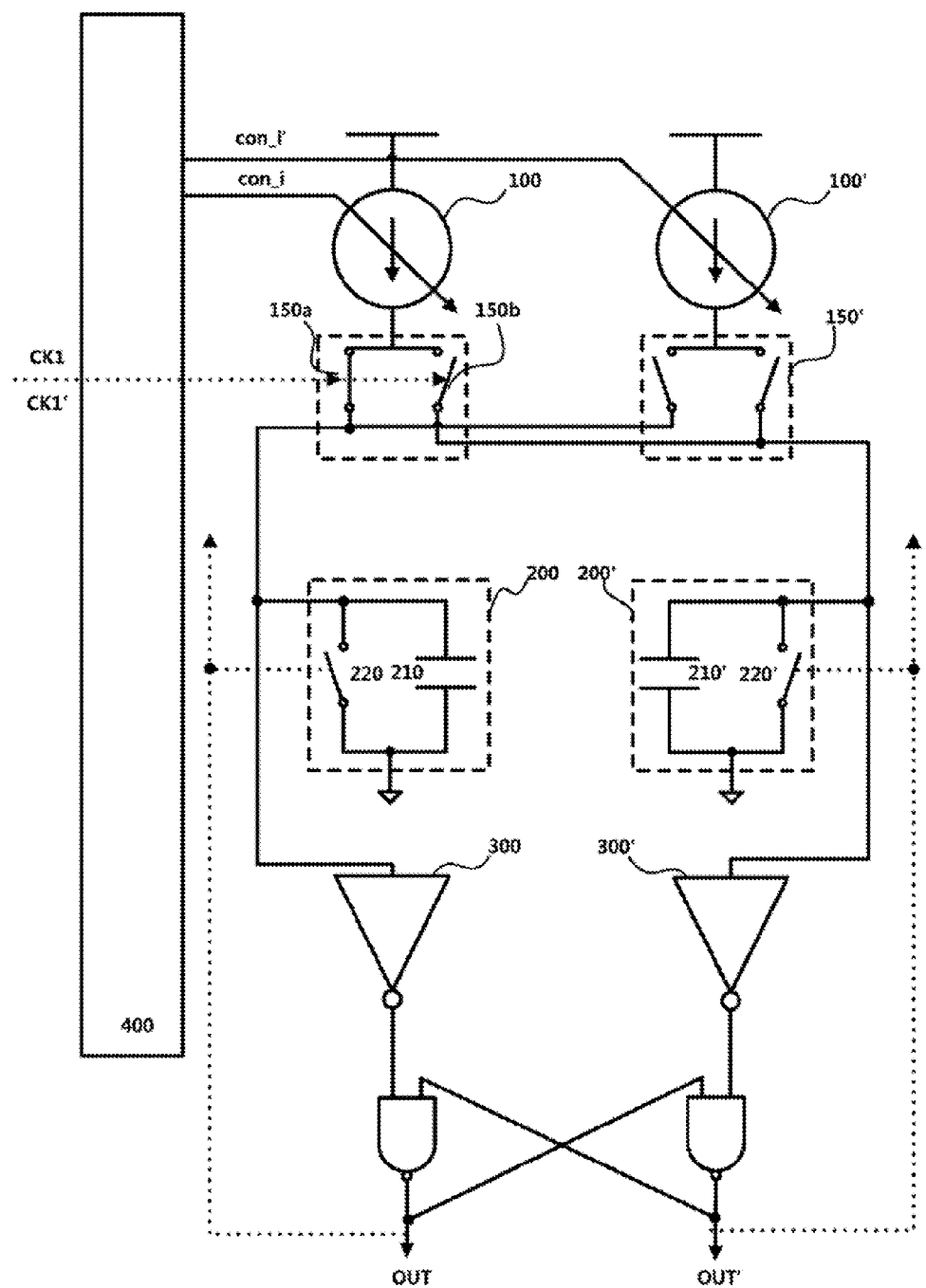
FIG. 14 is a circuit diagram showing an outline of a phase shifter implemented with programmable analog timing arrays according to the present embodiment.
Figure 15:
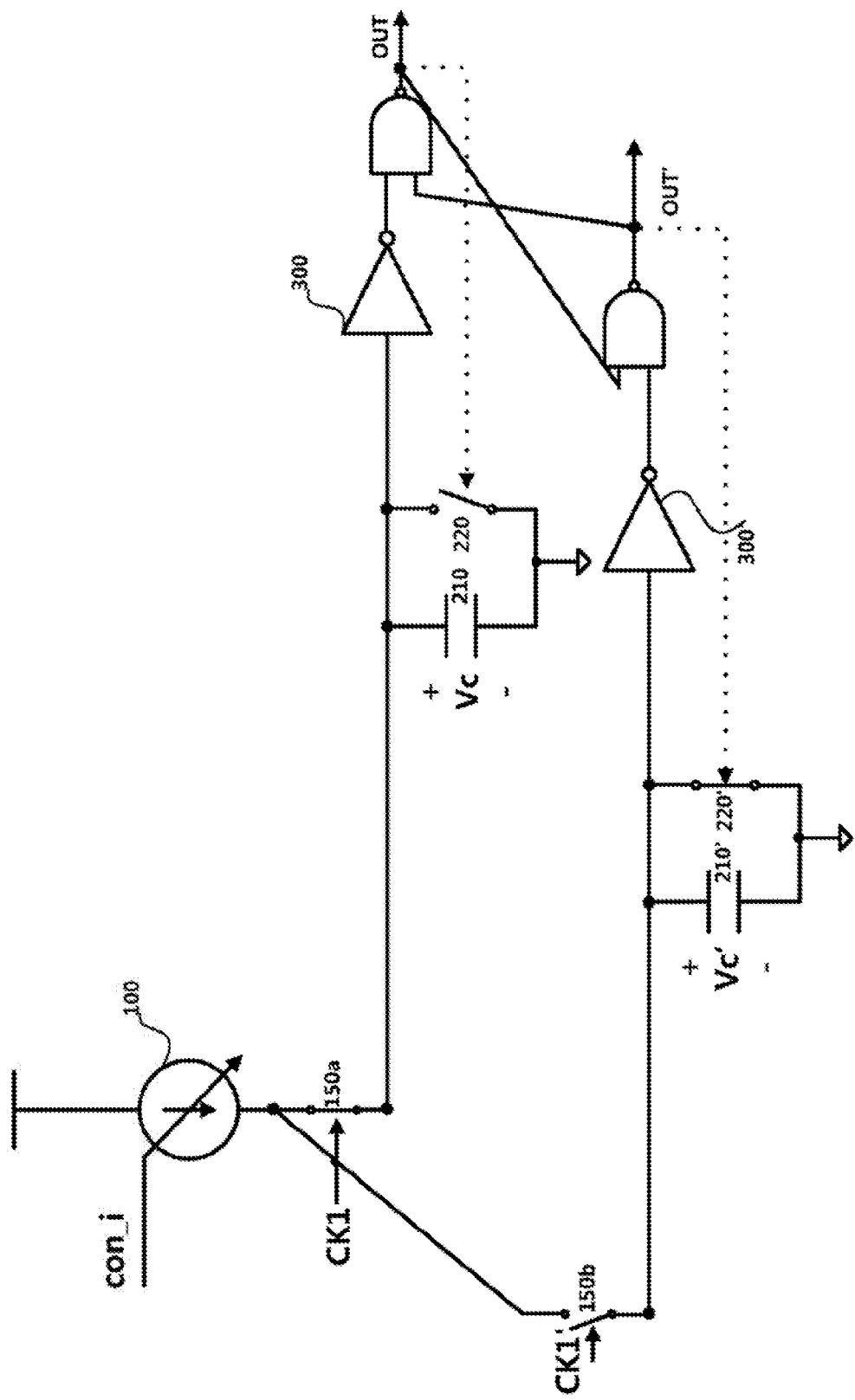
FIG. 15 is a schematic equivalent circuit diagram of the phase shifter implemented with programmable analog timing arrays according to the present embodiment.
Figure 16:
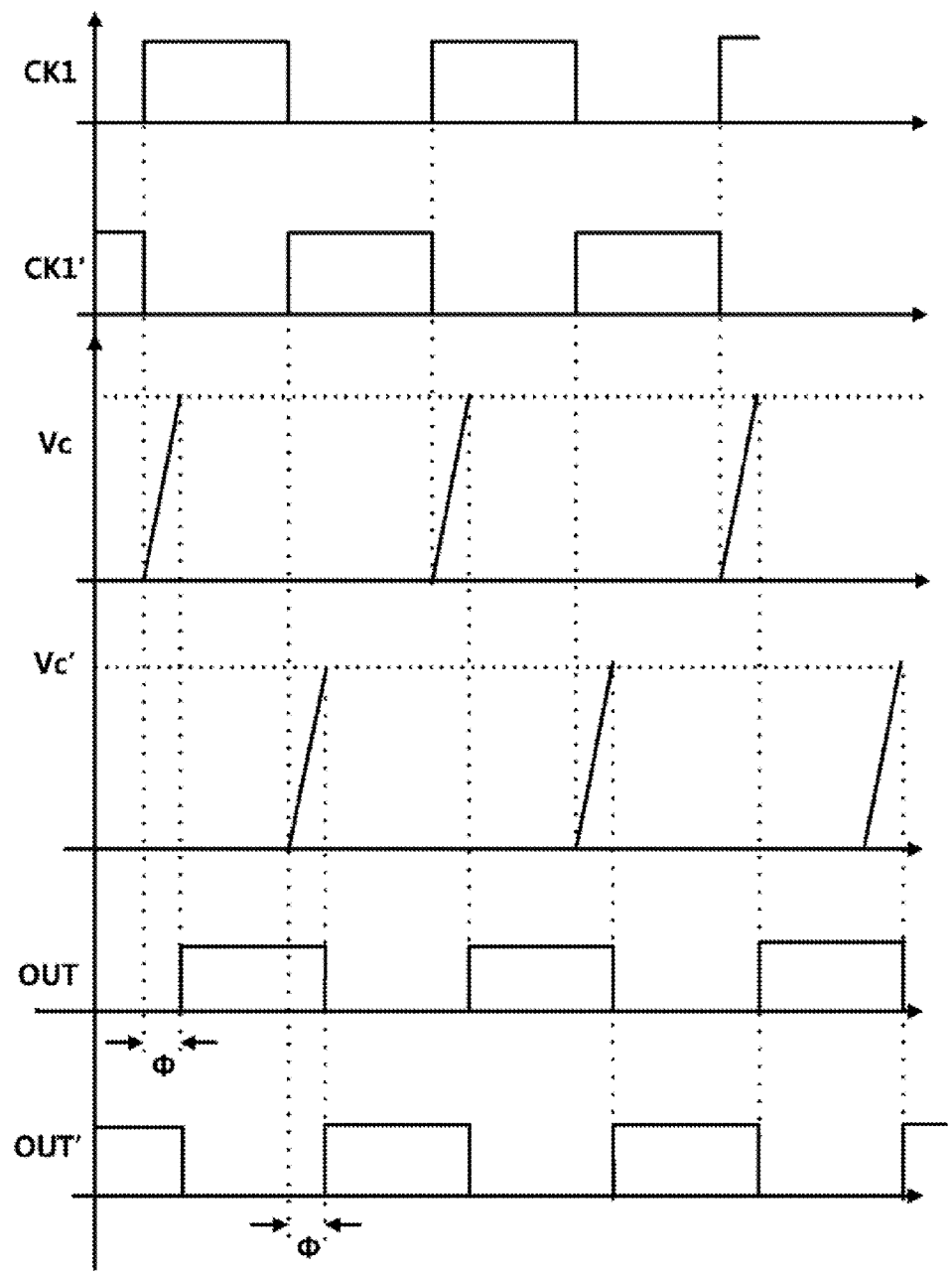
FIG. 16 is a timing diagram of the phase shifter.
Figure 17:
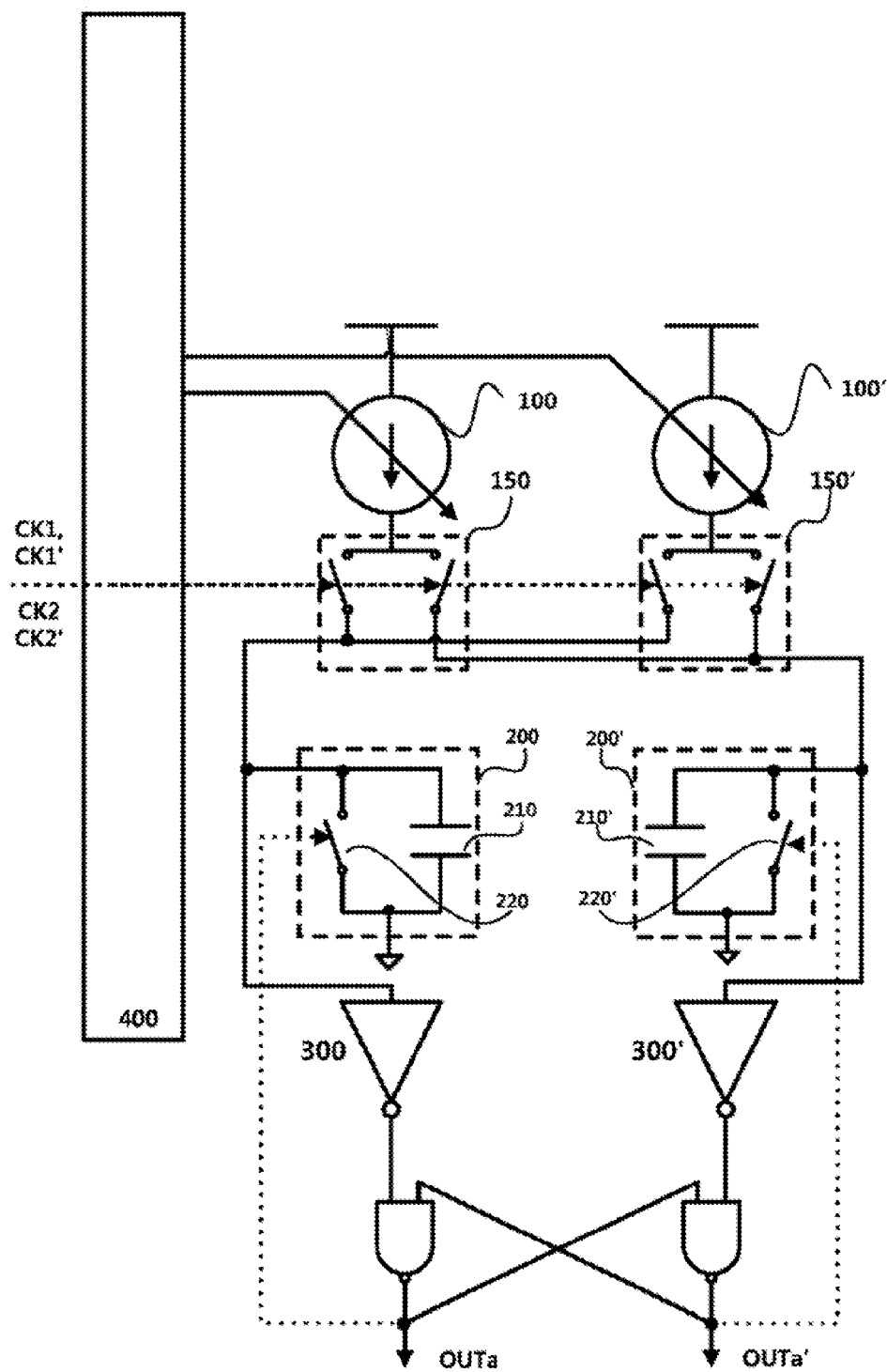
FIGS. 17 and 18 are circuit diagrams showing an outline of a phase interpolator (PI) implemented with programmable analog timing arrays according to the present embodiment.
Figure 18:
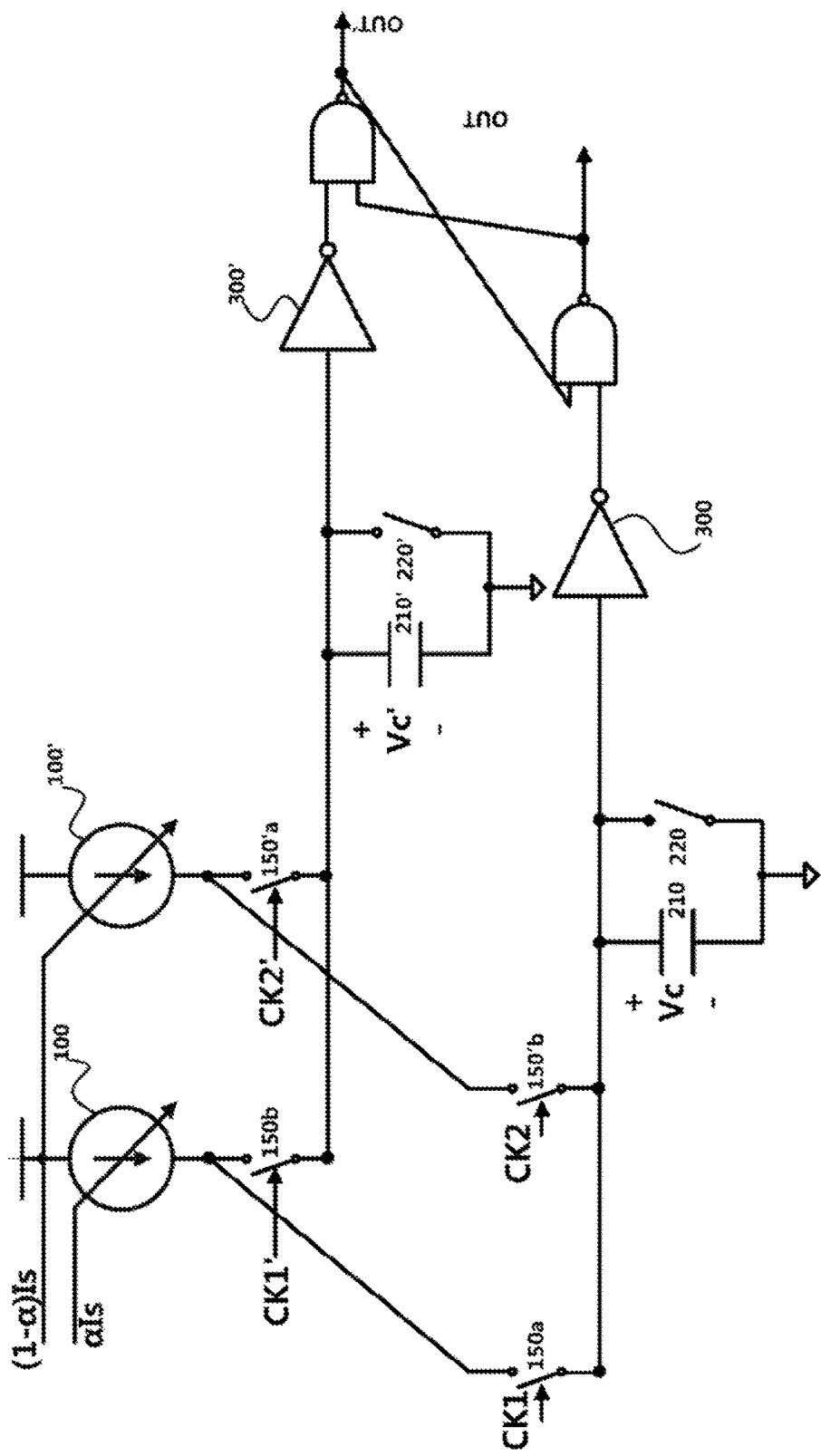
Figure 19:
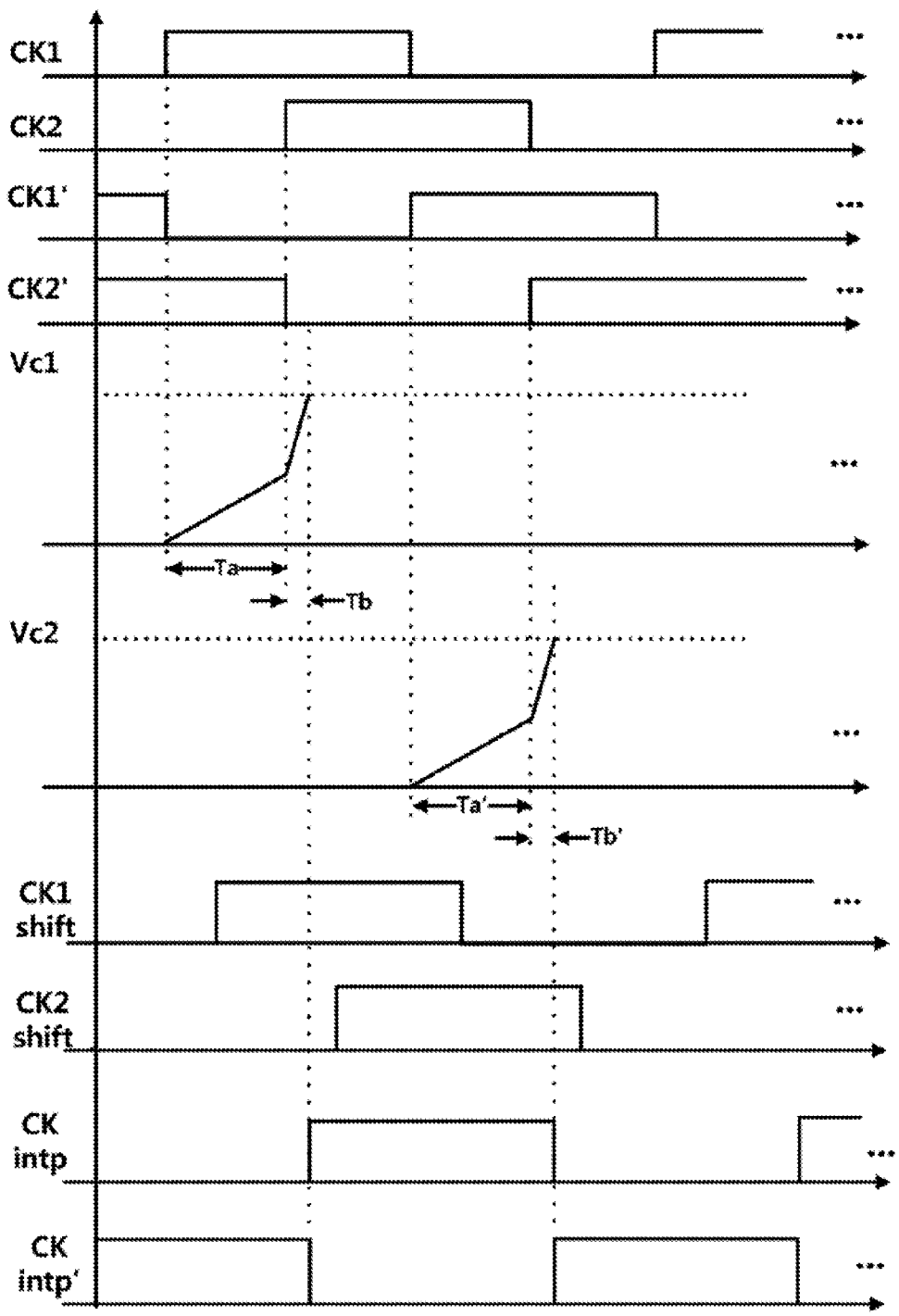
FIG. 19 is a timing diagram of the PI implemented with programmable analog timing arrays according to the present embodiment.

FIG. 14 is a circuit diagram showing an outline of a phase shifter implemented with programmable analog timing arrays according to the present embodiment, FIG. 15 is a schematic equivalent circuit diagram of the phase shifter implemented with programmable analog timing arrays according to the present embodiment, and FIG. 16 is a timing diagram of the phase shifter. FIGS. 17 and 18 are circuit diagrams showing an outline of a PI implemented with programmable analog timing arrays according to the present embodiment, and FIG. 19 is a timing diagram of the PI implemented with programmable analog timing arrays according to the present embodiment. While the phase shifter and the PI are described with reference to the drawings, duplicate content that has been already described may be omitted.

Referring to FIGS. 14 to 16, when programmable analog timing arrays are programmed to operate as a phase shifter and the program is stored in a memory, DACs 412 and 414 (see FIG. 6) control current sources 100 and 100' by providing control signals con_i and con_i' for controlling a current ratio to the current sources 100 and 100' so that the current source 100 applies a current, the current source 100' applies no current, and thus a signal provided by a user or applied during circuit operation corresponds to a code of the stored program. The DACs generate the control signals for controlling equivalent capacitances of capacitor units 210 and 210' to correspond to the code of the program and apply the control signals to the capacitor units.

A switch 150a which applies the current applied by the current source 100 to the capacitor unit 210 is controlled by an input signal CK1, and a switch 150b which applies the current applied by the current source 100 to the capacitor unit 210' is controlled by an input signal CK1' which is complementary to CK1. Also, both switches included in a switch unit 150' are controlled not to be closed.

When latch output signals OUT and OUT' are initially set by a reset signal to logic 0 and logic 1 respectively, the capacitor unit 210 accumulates the current applied by the current source 100 and generates a voltage signal Vc, but a switch 220' is closed by the signal OUT' which has been initially set to logic 1 so that the capacitor unit 210' cannot accumulate current.

Like the above-described case, when the output voltage Vc of the capacitor unit 210 is equal to or less than a threshold value, both detection means implemented as inverters output signals of logic 1, and thus the outputs of a latch are not changed from the states initially set by the reset signal. However, when the voltage of the voltage signal Vc which is generated by accumulating charge of the current applied by the current source 100 rises to the threshold value or more, the latch outputs are toggled. Therefore, a reset switch 220 is closed to discharge the charge stored in the capacitor unit 210, so that the output voltage Vc returns to the reference potential. Also, the closed reset switch 220' is opened, and the current applied by the current source 100 is applied to the capacitor unit 210', so that the capacitor unit 210' generates a voltage signal Vc'. The electric potential of the voltage signal Vc' rises to the threshold value or more, the latch outputs are toggled again.

With repetition of such a process, as shown in FIG. 16, CK1 is shifted by a predetermined phase Φ and output as OUT, and CK1' is likewise shifted by Φ and output as OUT'. In the present embodiment, since the shifted phase Φ is based on a time until a voltage generated by a current source applying a current to a discharged capacitor unit reaches the threshold value, the shifted phase can be controlled by controlling a current applied by a current source and/or an equivalent capacitance of a capacitor unit with a program. However, to use the phase shifter according to the present embodiment together with a PI described below, a current applied by any one current source is set to 100% in the phase shifter.

An embodiment of a PI implemented with programmable analog timing arrays according to the present embodiment will be described below. When a PI is implemented with programmable analog timing arrays, a user programs the current applied by the current source 100 (see FIGS. 14 and 15) in the phase shifter and the sum of currents applied by current sources of the PI of the present embodiment to be identical. Also, equivalent capacitances of the capacitor units 210 and 210' (see FIGS. 14 and 15) included in the programmable analog timing arrays implemented as the phase shifter and equivalent capacitances of the capacitor units 210 and 210' (see FIGS. 17 and 18) according to the present embodiment are programmed to be identical and stored in a memory. The DACs 410 and 420 (see FIG. 6) control equivalent capacitances of current sources and capacitor units according to a program provided by a user.

Referring to FIGS. 17 to 19, when a program is created to implement a PI with programmable analog timing arrays and stored in a memory, the DACs 412 and 414 (see FIG. 6) included in the memory control current sources by providing control signals for controlling a ratio of currents of the current sources 100 and 100' to correspond to a code of the program to the current sources. Also, the DACs generate control signals for controlling equivalent capacitances of the capacitor units 210 and 210' to correspond to the program code programmed and provided by a user and apply the control signals to the capacitor units.

An input signal CK1 is applied to a switch 150 so that the current of the current source 100 is applied to the capacitor unit 210 or blocked, and another input signal CK2 is applied to a switch 150'b so that the current of the current source 100' is applied to the capacitor unit 210 or blocked. Therefore, during a period in which only CK1 is logic 1, only the switch 150a is closed, and the current of the current source 100 is applied to the capacitor unit 210. However, during a period in which both CK1 and CK2 are logic 1, both the switch 150a and switch 150b' are closed, and both the currents applied by the current sources 100 and 100' are provided to the capacitor unit 210.

Likewise, during a period in which only CK1' that is an invert signal of CK1 is logic 1, only the switch 150b is closed, and the current of the current source 100 is applied to the capacitor unit 210'. However, during a period in which both CK1' and CK2' that is an invert signal of CK2 are logic 1, both the switch 150b and the switch 150b' are closed, and both the currents applied by the current sources 100 and 100' are provided to the capacitor unit 210'.

When a ratio of the current provided by the current source 100 to the current provided by the current source 100' is determined to be α and (1−α), a rising rate of a voltage during periods Tb and Tb' in which both the current sources apply currents is higher than a rising rate of a voltage generated at a capacitor during periods Ta and Ta' in which only one of the current sources applies a current, and thus the rising voltage has a steep slope as shown in the drawing.

When Vc or Vc' rises to the threshold value Vth or more, any one input of the latch is toggled, and accordingly a latch output voltage is toggled. Also, since currents applied by current sources included in the phase shifter and the PI are controlled, lengths of the periods Ta and Ta' are controlled to be identical, and lengths of the periods Tb and Tb' are also controlled to be identical. Therefore, the signals OUT and OUT' which are outputs of the latch have the same frequencies as CK1, CK2, and the invert signals.

Since a current applied by the current source 100 (see FIG. 15) in the phase shifter of FIG. 15 that shifts phases of CK1 and CK2 and the sum of the currents applied by the current sources 100 and 100' in the present embodiment are identical and equivalent capacitances of capacitor units are also identical, slopes Vc and Vc' of the voltages output by the capacitor units in FIG. 16 and slopes of Vc and Vc' during the periods Tb and Tb' are identical to each other.

In the PI according to the present embodiment, a ratio of lengths of the periods Ta and Tb can be adjusted by adjusting a ratio of the currents applied by the current sources 100 and 100'. It is possible to obtain a signal CKintp by interpolating a phase difference between the signals CK1 and CK2 shifted accordingly and an invert signal CKintp' thereof.

Figure 20:
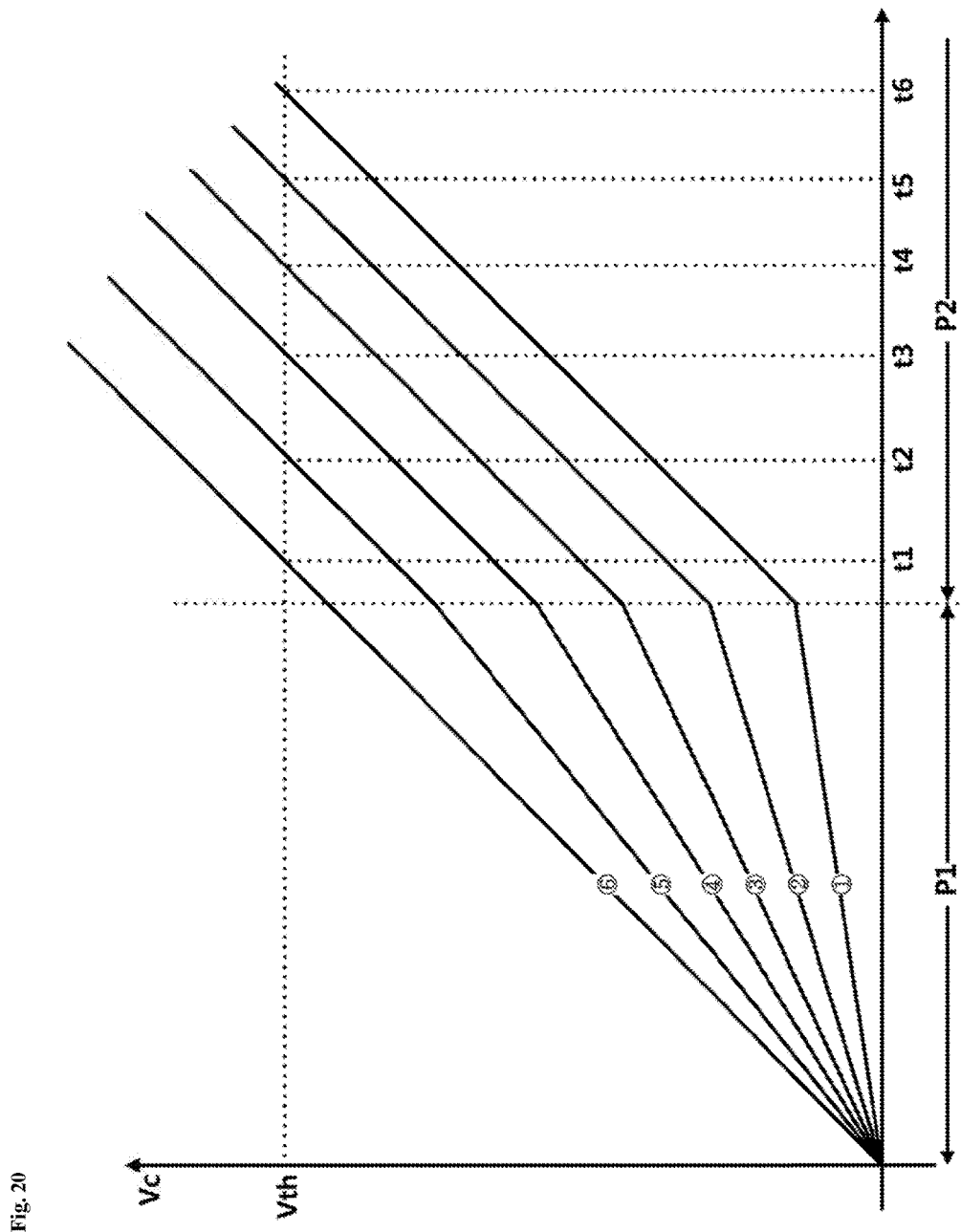
FIG. 20 is a diagram showing a change in voltage between both ends of a capacitor unit when different currents are applied to the capacitor unit having the same equivalent capacitance during different periods.

FIG. 20 is a diagram showing a change in voltage generated between both ends of a capacitor unit when different currents are applied to the capacitor unit having the same equivalent capacitance during different periods. In FIG. 20, a current is applied from only one current source to the capacitor unit during a period P1, and currents are applied from two current sources to the capacitor unit during a period P2. When a ratio of the currents applied by the two currents is α and (1−α), a straight line ⑥ shows a voltage generated at the capacitor unit in the case of α=1. In other words, since there is no difference between a current applied during the period P1 and the sum of currents applied during the period P2, a voltage Vc1 rises at the same slope in the periods P1 and P2. However, when α is not 1 and another current source applies a current during the period P2, voltage generated at the periods P1 and P2 have different slopes. In other words, in the case of ① in which α has a small value among comparison targets, the current applied by the current source is small, and the slope of a voltage generated during the same time is gentler than other cases. When the value of α increases, the voltage rises at a steeper slope, such as a straight line ②, a straight line ③, a straight line ④, and a straight line ⑤.

However, during the period P2, since the other current source applies the current together, all applied currents are identical. Since the same current is provided to the capacitor unit having the same capacitance during the same time, voltages rise at the same slope. Therefore, a user can control the slope of a rising voltage during the period P1 by controlling the value of α, which is a ratio of the current applied by the current source, during the period P1 through a program. Accordingly, it is possible to adjust points in time t1, t2, . . . , and t6 at which a voltage Vc generated and output by a capacitor reaches the threshold value Vth, and a phase of an interpolated output signal can be controlled thereby.

Figure 21:
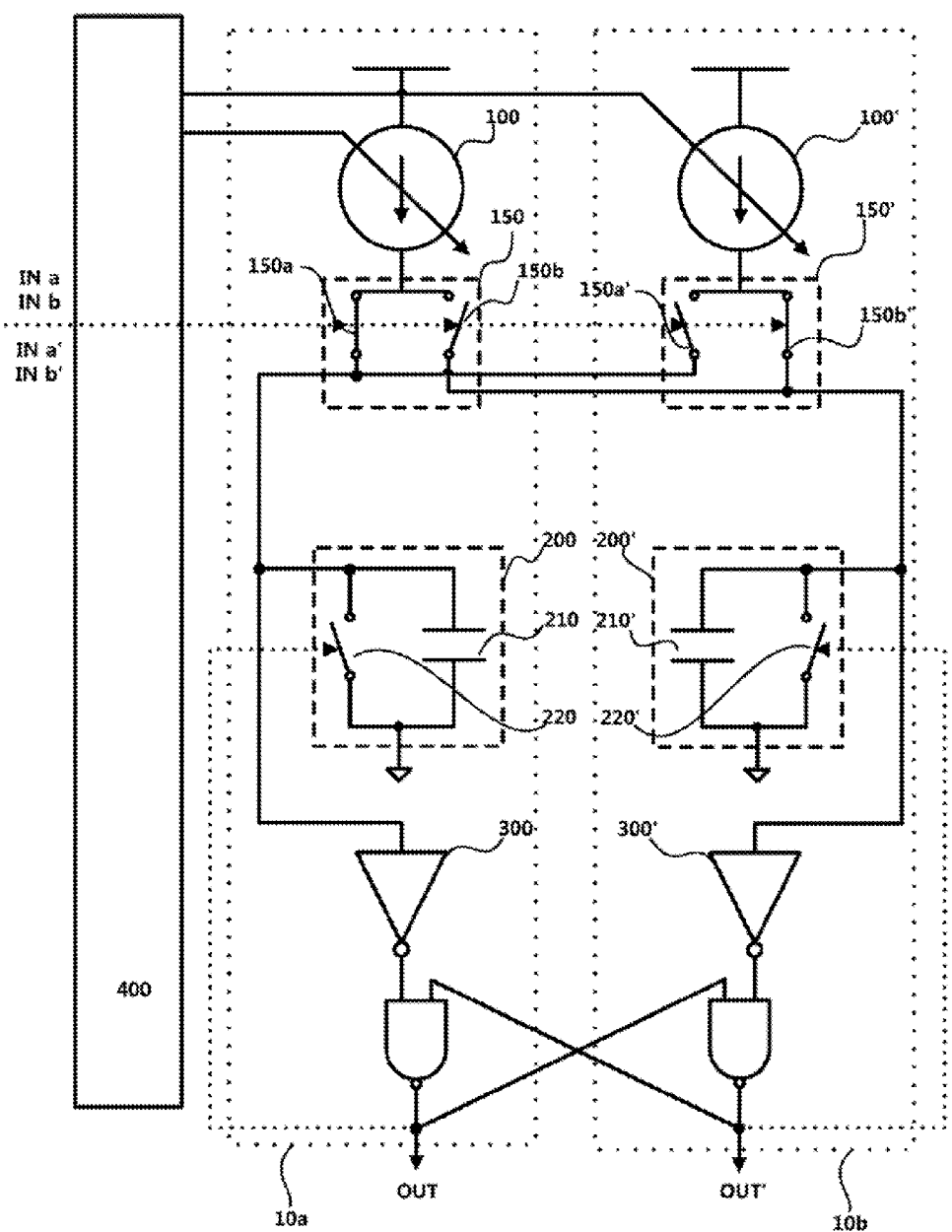
FIG. 21 is a schematic circuit diagram of a pseudo exponential digital control oscillator implemented with programmable analog timing arrays according to the present embodiment.

A pseudo exponential digital control oscillator implemented with a field-programmable mixed signal array, a field-programmable analog array, and a programmable analog timing array according to the present embodiment will be described below with reference to FIGS. 21 and 22. FIG. 21 is a schematic circuit diagram of a pseudo exponential digital control oscillator implemented with a field-programmable analog array according to the present embodiment.

As for an existing digital oscillator which receives a digital code and outputs a frequency corresponding to the digital code, a frequency characteristic, such as a bandwidth, etc., of an electronic circuit, particularly a digital phase locked loop (DPLL), including the digital oscillator is changed according to process-voltage-temperature (PVT) variations. To obtain a DPLL capable of suppressing a change in a frequency characteristic resulting from PVT variations, it is required to implement a digital oscillator that outputs a signal having a frequency exponentially changed according to an applied digital code.

$$i = C\frac{dV}{dt}, f = \frac{i}{2CdV} \text{ where } f = \left(\frac{1}{2dt}\right)$$ [Expression 2]

Expression 2 expresses a relationship between a current and a frequency of an applied signal in a current-voltage relation equation of a capacitor. It can be seen from Expression 2 that a frequency of an output signal is proportional to an applied current.

$$e^{ax} = \frac{e^{\frac{ax}{2}}}{e^{-\frac{ax}{2}}} = \frac{1 + \frac{ax}{2} + \frac{\left(\frac{ax}{2}\right)^2}{2!} + \ldots}{1 - \frac{ax}{2} + \frac{\left(\frac{ax}{2}\right)^2}{2!} + \ldots} \approx \frac{1 + \frac{ax}{2} + \frac{\left(\frac{ax}{2}\right)^2}{2!}}{1 - \frac{ax}{2} + \frac{\left(\frac{ax}{2}\right)^2}{2!}}$$ [Expression 3]

$$e^{ax} \approx \frac{1 + \frac{ax}{2}}{1 - \frac{ax}{2}}, \text{ where } \frac{\left(\frac{ax}{2}\right)^2}{2!} \ll 1$$ [Expression 4]

Expression 3 is a pseudo exponential expression that is approximated within a range in which ax is sufficiently small after an exponential function is expressed as a Taylor series, and Expression 4 is obtained by rearranging Expression 3. When a current of a numerator in the current-frequency relation equation of Expression 2 is controlled to correspond to a numerator of Expression 4 and a capacitance of Expression 2 is controlled to correspond to a denominator of Expression 3, it is possible to implement a pseudo exponential digital control oscillator using a field-programmable mixed signal array, a field-programmable analog array, and a programmable analog timing array according to the present embodiment.

Referring to FIG. 21, the pseudo exponential oscillator includes a pair of programmable analog timing arrays that output complementary values. In the present embodiment, a control signal INaa for controlling a switch 150aa causes the switch 150aa to provide a current provided by a current source 100a to a capacitor unit 210, and a control signal Inab' for controlling a switch 150ab' controls the switch 150ab' to provide a current provided by a current source 100a' to a capacitor unit 210'. Also, control signals INaa' and INab control switches 150ab and 150aa' to be opened. Therefore, the currents applied by the current sources 100a and 100a' are applied to capacitors, and signals having an offset frequency are generated by detection means and a latch.

Also, a switch 150ba is controlled by a control signal INba to provide a current provided by a current source 100b to the capacitor unit 200, and a switch bb' is controlled by a control signal INbb' to provide a current provided by a current source 100b' to the capacitor unit 210'. The switches 150bb and 150ba' are controlled to be opened by control signals INbb and INba', respectively.

$$f_{output} = f_{offset} + \Delta f$$ [Expression 5]

Referring to Expression 5, when an output frequency is f, the output frequency can be expressed as the sum of a frequency component $f_{offset}$ generated by the currents provided by the current sources 100a and 100a' and a frequency component $\Delta f$ generated by the current provided by the current sources 100b and 100b'.

The current sources 100b and 100b' are controlled by a program stored in a memory, and equivalent capacitances of the capacitor units 210 and 210' are also controlled by a program. Therefore, it is possible to implement a digital control oscillator in which frequencies of output signals increase exponentially when current sources and equivalent capacitances of capacitor units are programmed and controlled so that the equivalent capacitances are reduced while currents applied by the current sources are increased, and the frequencies of the output signals decrease exponentially when the current sources and the equivalent capacitances of the capacitor units are programmed and controlled so that the equivalent capacitances increase while the currents applied by the current sources are reduced.

An example of a DPWM implemented with a field-programmable mixed signal array, a field-programmable analog array, and a programmable analog timing array according to the present embodiment will be described below with reference to FIGS. 22 to 24. An analog-digital converter (ADC) will be described below with reference to FIG. 25, and an implementation example of a DC-DC converter employing a field-programmable mixed signal array, a field-programmable analog array, and a programmable analog timing array according to the present embodiment will be described below with reference to FIGS. 26 and 27.

Figure 22:
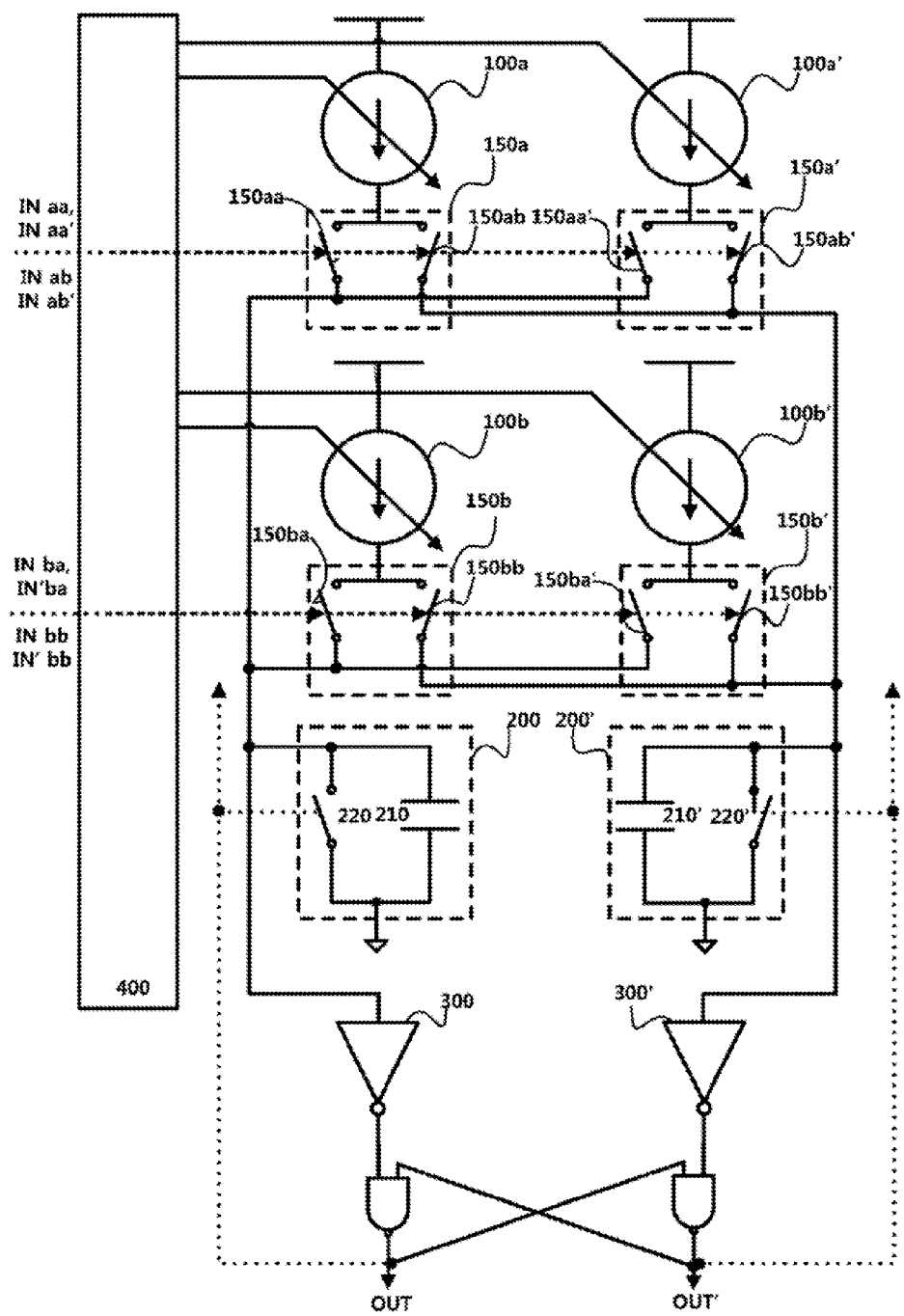
FIG. 22 is a schematic circuit diagram of a digital pulse width modulator (DPWM) implemented with programmable analog timing arrays according to the present embodiment.
Figure 23:
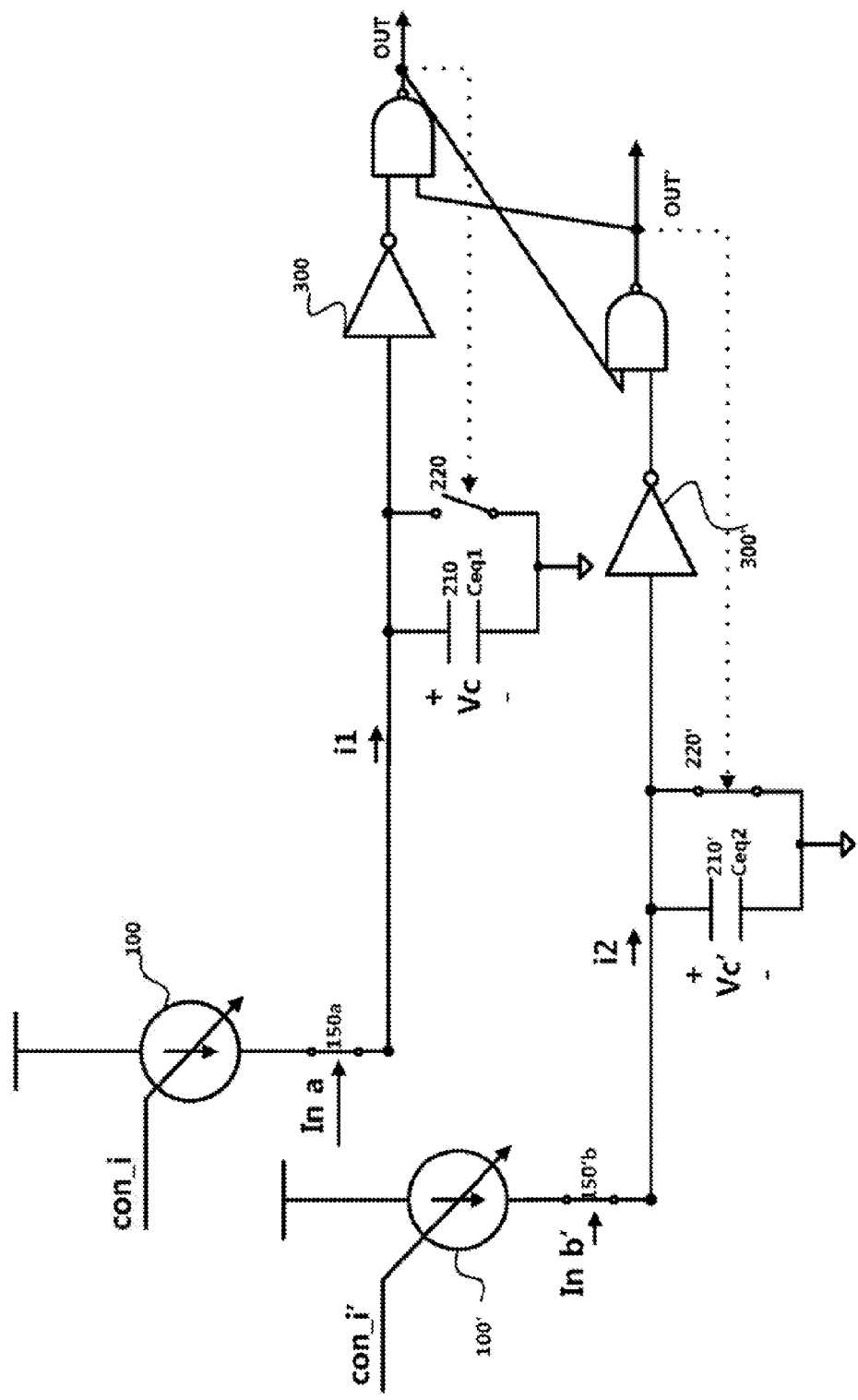
FIG. 23 is an equivalent circuit diagram of the DPWM employing programmable analog timing arrays according to the present embodiment.
Figure 24:
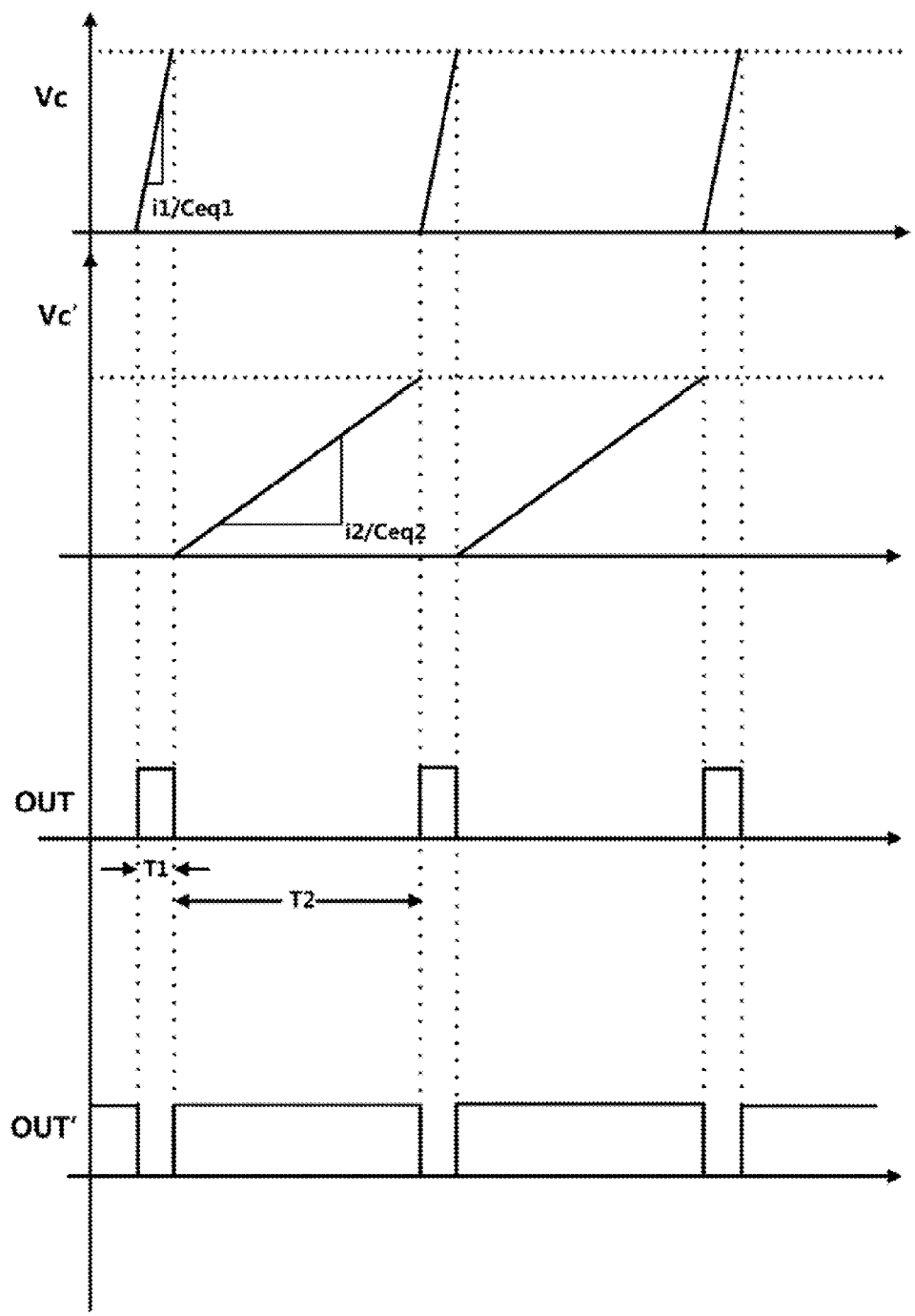
FIG. 24 is a timing diagram of the pulse width modulator implemented with programmable analog timing arrays according to the present embodiment.

FIG. 22 is a schematic circuit diagram of a DPWM implemented with a field-programmable mixed signal array, a field-programmable analog array, and programmable analog timing arrays according to the present embodiment, FIG. 23 is an equivalent circuit diagram of the DPWM employing a field-programmable mixed signal array, a field-programmable analog array, and programmable analog timing arrays according to the present embodiment, and FIG. 24 is a timing diagram of the pulse width modulator implemented with a field-programmable mixed signal array, a field-programmable analog array, and programmable analog timing arrays according to the present embodiment. Referring to FIGS. 22 to 24, the pulse width modulator includes two programmable analog timing arrays 10a and 10b.

When it is tried to implement a pulse width modulator with the programmable analog timing arrays 10a and 10b, currents applied by current sources 100 and 100', equivalent capacitances of capacitor units 210 and 210', and/or ratios of the currents to the equivalent capacitances are programmed and stored in a memory. This is because it is possible to adjust a duty ratio of an output signal according to each of a current and an equivalent capacitance or a ratio of the current to the equivalent capacitance in each programmable analog timing array as will be described below. As described above, the currents, the equivalent capacitances of the capacitor units 210 and 210', and/or ratios of the currents to the equivalent capacitances may be controlled by a signal provided by a field-programmable digital block, a custom cell block, or another field-programmable analog array during circuit operation.

It is assumed that output signals OUT and OUT' of a latch have been respectively initialized to logic 0 and logic 1 by a reset signal. Also, switches 150a and 150b' are controlled by signals IN a and IN b' to be kept closed, and switches 150b and 150a' are controlled by signals IN b and IN a' to be kept open. In an embodiment, the output signals OUT and OUT' of the latch may be fed back by a field-programmable connecting wire block to control switches, and in another embodiment, the switches 150b and 150'a may be controlled to be constantly opened.

The switches 150b and 150'a are controlled to be opened, and the switches 150a and 150b' are closed to apply the current provided by the current source 100 to a charge accumulation means 200 and apply the current provided by the current source 100' to a charge accumulation means 200', respectively.

A current i1 provided by the current source 100 is accumulated in the capacitor unit 210 to generate a voltage signal Vc, but a current i2 provided by the current source 100' flows to a reference potential due to a reset switch 220'. When the voltage Vc generated by accumulating the current provided by the current source 100 exceeds a threshold value Vth, the signal OUT which is a latch output is toggled to logic 0, and the signal OUT' is toggled to logic 1.

When a current i applies a total amount of charge Q to a capacitor having a capacitance C, a voltage V is generated according to Expression 6 below.

$$V = \frac{Q}{C} = \frac{i \cdot t}{C} \qquad \text{[Expression 6]}$$

Therefore, a voltage change rate with respect to time $$\frac{V}{t}$$

equals $$\frac{i}{C}.$$

When a ratio of a current to an equivalent capacitance $$\frac{i_1}{C_{eq1}}$$

is programmed to be greater than $$\frac{i_2}{C_{eq2}},$$

rising rates of voltages Vc1 and Vc2 with respect to time are different as shown in FIG. 24. In other words, since $$\frac{i_1}{C_{eq1}}$$

is greater than $$\frac{i_2}{C_{eq2}},$$

Vc1 rises at a steeper slope than Vc2. Therefore, Vc reaches the threshold value faster than Vc', and an output voltage of the latch is toggled. In other words, a time T1 in which OUT is logic 1 is shorter than T2.

Since $$\frac{i_2}{C_{eq2}}$$

is smaller than $$\frac{i_1}{C_{eq1}},$$

Vc2 rises at a gentler slope than Vc1, and a time required for Vc2 to reach the threshold value is longer than a time required for Vc1 to reach the threshold. Therefore, the time T2 in which the signal OUT is logic 0 is longer than T1.

Consequently, when a duty ratio of the signal OUT is defined as a ratio of the time T1 in which the signal OUT is logic 1 to one period T1+T2 of the signal OUT, a duty ratio D is expressed by Expression 7 below.

$$D = \frac{T1}{T1+T2} = \frac{\frac{C_{eq1} \cdot Vth}{i_1}}{\frac{C_{eq1} \cdot Vth}{i_1} + \frac{C_{eq2} \cdot Vth}{i_2}} = \frac{\frac{C_{eq1}}{i_1}}{\frac{C_{eq1}}{i_1} + \frac{C_{eq2}}{i_2}} \qquad \text{[Expression 7]}$$

Pulse widths of the output signals output from the latch can be modulated by adjusting a ratio of a current to an equivalent capacitance in each programmable analog timing array. Also, in the above expression, when the currents i1 and i2 applied by the current sources are programmed to be identical, the duty ratio can be expressed by Expression 8 below and controlled with a Ceq1-to-Ceq2 ratio.

$$D = \frac{C_{eq1}}{C_{eq1} + C_{eq2}} \quad \text{[Expression 8]}$$

In Expression 8 given above, when both the equivalent capacitances are programmed to be identical, the duty ratio D can be expressed by Expression 9 below and expressed as a ratio of the currents applied by the current sources.

$$D = \frac{i_2}{i_1 + i_2} \quad \text{[Expression 9]}$$

Therefore, by adjusting a current ratio for an equivalent capacitance, a current ratio, or an equivalent capacitance ratio and controlling a switching unit, a DPWM capable of controlling a duty ratio of a pulse with a digital code can be implemented with programmable analog timing arrays. Also, during operation of a circuit, a signal provided by a field-programmable analog array, a field-programmable digital block, and/or a custom cell block is received, and the circuit can be controlled in real time to change a duty ratio of an output signal.

Figure 25:
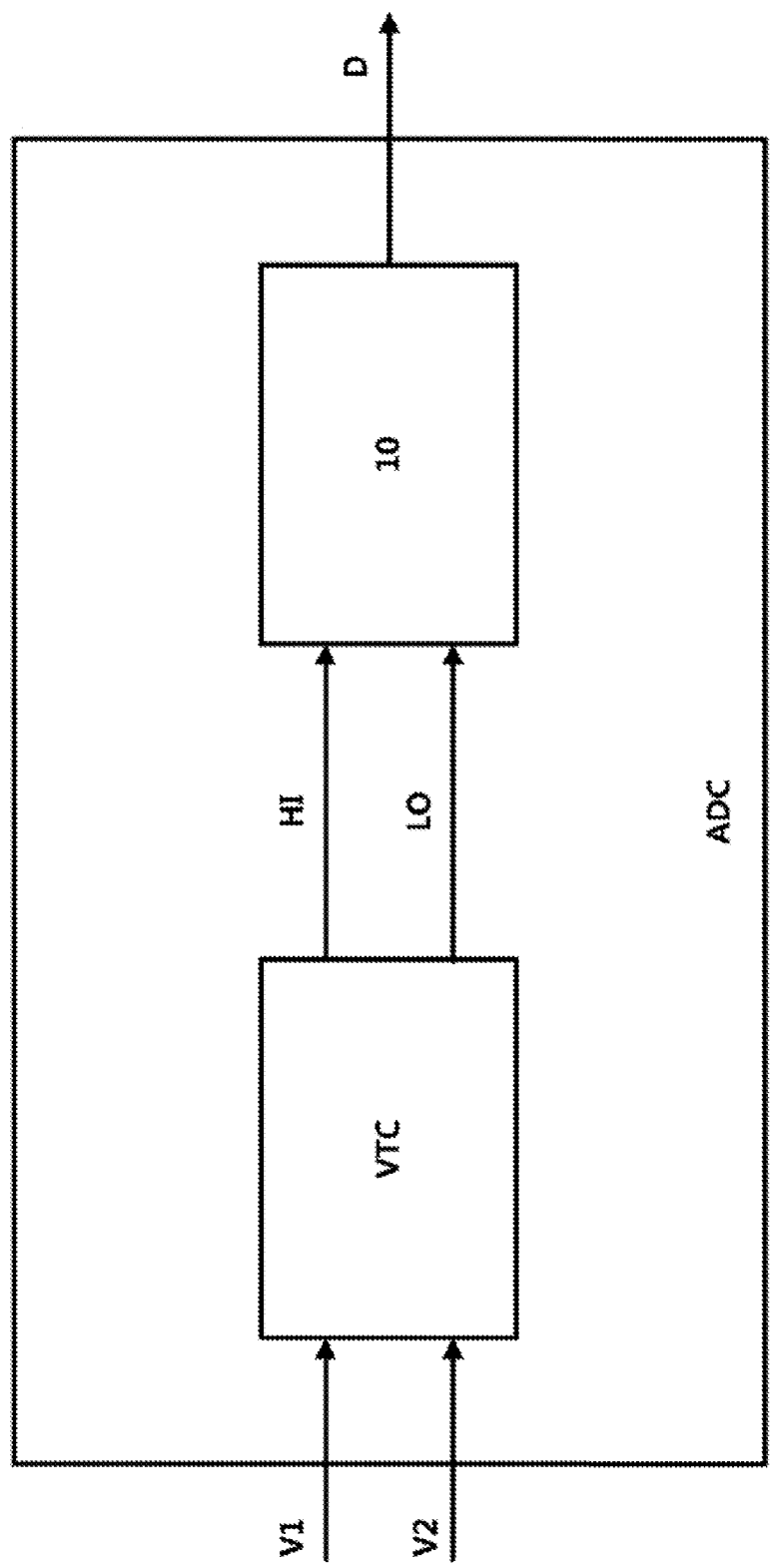
FIG. 25 is a schematic block diagram of an analog-digital converter (ADC) implemented with programmable analog timing arrays according to the present embodiment.

FIG. 25 is a schematic block diagram of an ADC implemented with a field-programmable mixed signal array, a field-programmable analog array, and a programmable analog timing array according to the present embodiment. Referring to FIG. 25, the ADC includes a VTC and a TDC. The VTC receives two signals V1 and V2 and outputs a signal having a pulse width corresponding to an amplitude difference between the signals V1 and V2. For example, a circuit that performs a function of the VTC is previously formed and disposed in a custom cell block.

The TDC has functions similar to those of the TDC described with reference to FIGS. 11 to 13. The TDC described with reference to FIGS. 11 to 13 outputs the signals UP and DN having a pulse width corresponding to a phase difference between the signals ref and rcv provided by the PFD 20 (see FIG. 11). Each of the programmable analog timing arrays 10a and 10b outputs a pulse train corresponding to a pulse width of the signal UP, and pulse trains are counted by the counters 30a and 30b and output.

The ADC described with reference to FIG. 25 also performs the corresponding operations. The VTC provides the signal having the pulse width corresponding to the amplitude difference between the signals V1 and V2 provided as inputs. For example, the VTC outputs a high signal HI when an amplitude of the signal V1 is larger than an amplitude of the signal V2, and outputs a low signal LO when the amplitude of the signal V1 is smaller than the amplitude of the signal V2. As mentioned above, the amplitude difference between the signals V1 and V2 corresponds to the pulse width of the signal HI or LO.

The signals HI and LO are provided to analog timing blocks (see 10a and 10b in FIGS. 11 and 12) corresponding to those described with reference to FIGS. 11 to 13 and provide pulse trains having the number of pulses corresponding to pulse widths thereof. Therefore, when the number of pulses included in a pulse train is counted, it is possible to know an amplitude difference of an input signal provided to the ADC.

Figure 26:
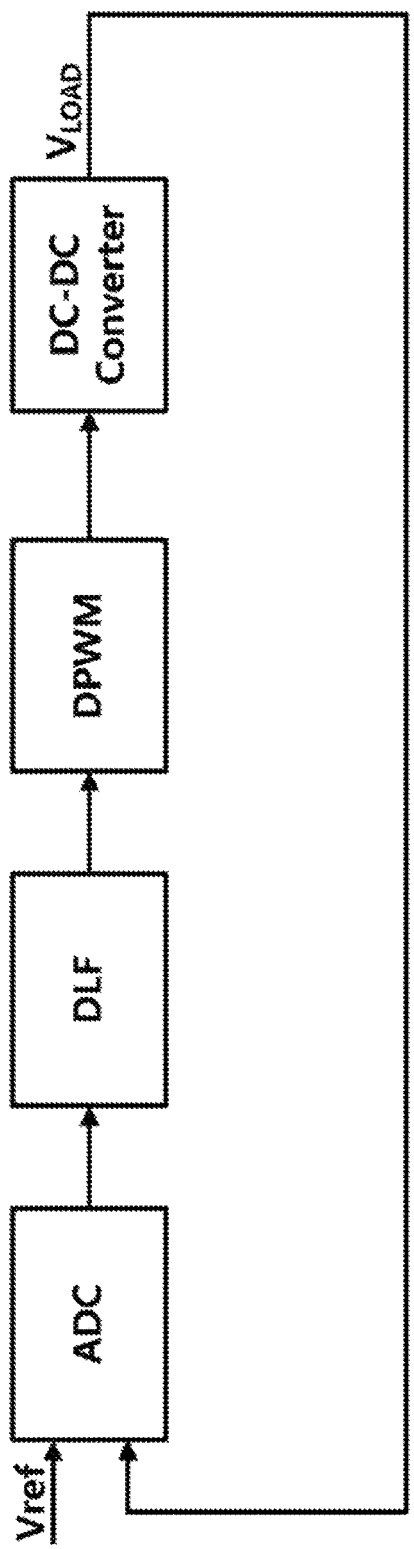
FIG. 26 is a block diagram showing an implementation example of a direct current (DC)-DC converter according to the present embodiment.

FIG. 26 is a block diagram showing an implementation example of a DC-DC converter according to the present embodiment. FIG. 27A is a schematic circuit diagram illustrating operation of a buck converter which is a conventional step-down DC-DC converter, and FIG. 27B is a schematic circuit diagram illustrating operation of a boost converter which is an existing step up DC-DC converter.

Referring to FIG. 27A, when a switch SW is closed, a current flows from a power source through an inductor L as indicated by an alternate long and short dashed line. Therefore, the inductor is charged with energy, and power is supplied to a load Load. While the switch SW is closed, a reverse voltage is applied to a diode, and thus the diode does not become conductive. When the switch is opened, the energy stored in the inductor L is discharged in the form of a current, and the current flows in a direction indicated by a dotted line and supplies power to the load. The current flowing through the inductor and the direction of the current are continuously maintained immediately before and after switching. Therefore, the current flowing through the inductor immediately after opening of the switch flows in the direction in which the current has flowed while the switch was closed, and the current is reduced over time because the energy charged in the inductor is discharged. At this time, when the switch is closed, the current flows from the power source through the switch along the alternate long and short dashed line again and charges energy in the inductor. A capacitor C connected in parallel with the load prevents a sudden change in a voltage $V_{LOAD}$ applied to an end of the load.

$$V_{LOAD} = D \cdot Vi \ \{0 \le D \le 1\}. \quad \text{[Expression 10]}$$

The buck converter controls an output voltage by adjusting a duty ratio of the switch. When the duty ratio is D, an input voltage is Vi, and the output voltage is Vo, the output voltage can be expressed by Expression 10 given above. Therefore, it is possible to control the output voltage $V_{LOAD}$ by adjusting a duty ratio of a pulse applied to the switch.

Referring to FIG. 27B that is a schematic circuit diagram of a boost converter which is a step up DC-DC converter, when a switch SW is closed, a current flows from a power source through an inductor L as indicated by an alternate long and short dashed line. Therefore, the inductor is charged with energy, and power is not supplied to a load Load. While the switch SW is closed, a diode does not become conductive. When the switch is opened, the energy stored in the inductor L is discharged in the form of a current, and the current flows in a direction indicated by a dotted line and supplies power to the load. The current flowing through the inductor and the direction of the current are continuously maintained immediately before and after switching. Therefore, the current flowing through the inductor immediately after opening of the switch flows in the direction in which the current has flowed while the switch was closed, and the current is reduced over time because the energy charged in the inductor is discharged. At this time, if the switch is closed, the current flows from the power source along the alternate long and short dashed line again and charges energy in the inductor. A capacitor C connected in parallel with the load prevents a sudden change in a voltage $V_{LOAD}$ applied to an end of the load.

When the switch is opened, the power source, the inductor, and the load are connected in series. Therefore, the voltage applied to the load equals the sum of a voltage provided by the power source and a voltage generated by the inductor and is expressed by Expression 11 below.

$$V_{LOAD} = \frac{1}{1-D} Vi \ (0 \le D \le 1) \quad \text{[Expression 11]}$$

In other words, the boost converter can control an output voltage by adjusting a duty ratio of the switch. As denoted by the above expression, when a duty ratio of a pulse applied to the switch gets closer to 1, it is possible to obtain the output voltage $V_{LOAD}$ higher than a supply voltage.

Referring to FIG. 26, a signal $V_{LOAD}$ output by a DC-DC converter unit is fed back and input to an ADC. As described above, the ADC provides a signal corresponding to an amplitude difference between an applied reference potential Vref and the signal $V_{LOAD}$ which has been fed back and applied to a digital loop filter (DLF).

The DLF may be implemented with a field-programmable digital block that receives a program from a user and performs a programmed function. The DLF performs proportional-integral-derivative (PID) control using the received amplitude difference signal. In other words, the DLF calculates a control value by calculating an error value between the reference signal Vref and the output signal $V_{LOAD}$, an integral of the error value, and a derivative of the error value, and provides the calculation result to a DPWM. The control value provided by the DLF is provided as a program to the DPWM implemented with a programmable analog timing array according to the present embodiment and stored in a memory.

During circuit operation, the DPWM implemented with the programmable analog timing array is controlled in real time by a calculation value provided from the outside of the DPWM, changes a duty ratio of a signal output to the DC-DC converter unit, and provides the signal, thereby modifying the output signal $V_{LOAD}$.

Figure 28:
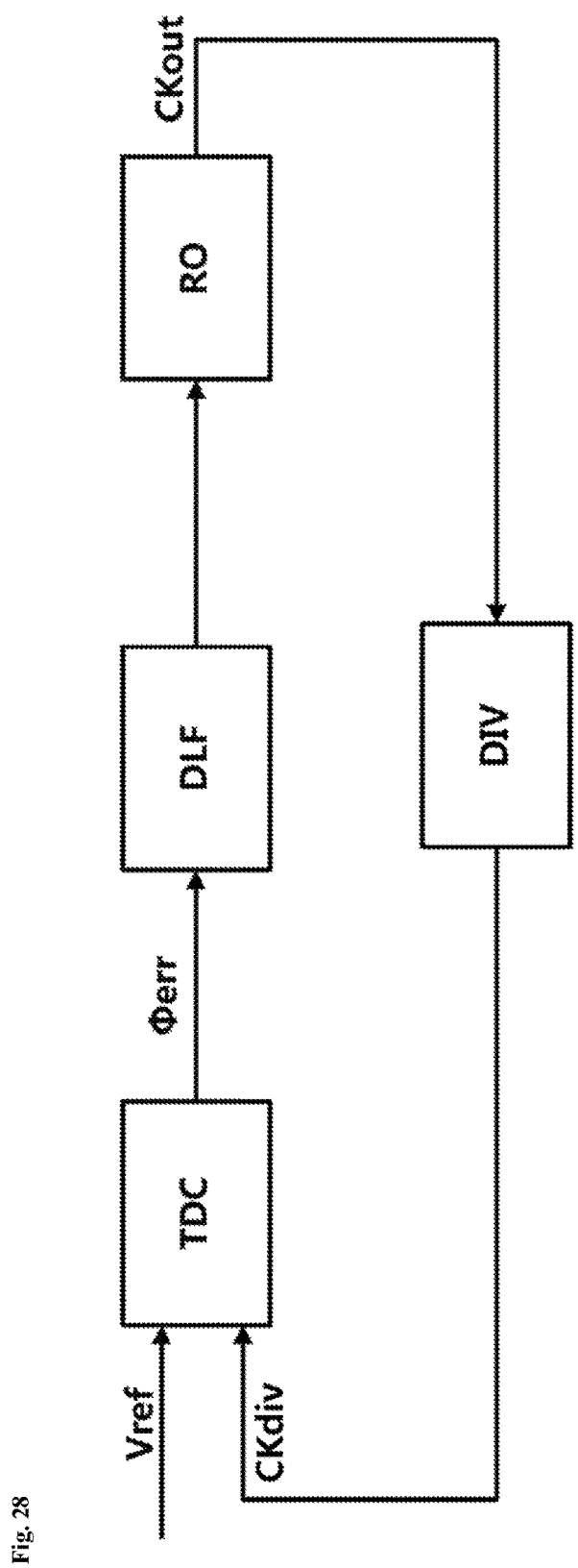
FIG. 28 is a block diagram showing an outline of a digital phase locked loop (DPLL) implemented with a programmable analog timing array according to the present embodiment.

A DPLL implemented with a field-programmable mixed signal array, a field-programmable analog array, and a programmable analog timing array according to the present embodiment will be described below with reference to FIG. 28. FIG. 28 is a block diagram showing an outline of a DPLL implemented with a field-programmable mixed signal array, a field-programmable analog array, and a programmable analog timing array according to the present embodiment. Referring to FIG. 28, the DPLL according to the present embodiment includes a TDC, a DLF, an RO, and a frequency divider Div. As described above, the RO can be implemented with a programmable analog timing array. An output signal Vo provided by the RO is routed to a field-programmable connecting wire block (FIG. 7, 3000) and provided to the frequency divider DIV.

The frequency divider DIV receives an output signal CKout provided by the RO and outputs a signal CKdiv obtained by frequency-dividing the output signal CKout at a predetermined frequency division ratio to the TDC. The frequency divider DIV may be formed of a field-programmable digital block 2000 due to a user providing a program, or a circuit may be previously implemented to perform a function of the frequency divider and disposed in a custom cell block.

The TDC may be implemented with the TDC described with reference to FIGS. 11 to 13. As described above, the TDC outputs signals UP and DN having a pulse width corresponding to a phase difference between a reference signal Vref and the frequency-divided signal CKdiv output by the frequency divider, each of programmable analog timing arrays 10a and 10b outputs a pulse train corresponding to a pulse width of the signal UP, and pulse trains are counted by counters 30a and 30b and output. Therefore, an error signal err that is output after the counting by the counters has time difference information between the reference signal Vref and the frequency-divided signal CKdiv.

The error signal Φerr is applied to the DLF. The DLF receives the error signal Φerr, performs a signal processing process, and provides a signal for controlling the RO. The DLF may be a digital low-pass filter and controls a PI. In other words, the DLF calculates a control value using an error value of the error signal, a proportional term corresponding to an integral of the error value, and an integral term and provides the control value to the RO.

The RO stores the control value received during operation in a memory and controls the programmable analog timing array using the control value, so that the output signal CKout has an intended frequency and an intended phase.

Since a field-programmable mixed signal array, a field-programmable analog array, and a programmable analog timing array according to the present embodiment make it possible to change a configuration and a function according to a change in a connection relationship of an internal circuit by a program provided by a user, there is an advantage in that the user can perform an intended function in the field. Also, there is an advantage in that the circuit can be controlled in real time by a signal provided during operation of the circuit.

To help understanding the present invention, the present invention has been described with reference to embodiments shown in the drawings. However, the embodiments are merely illustrative, and it will be understood by those of ordinary skill in the art that various modifications and equivalents can be made from the embodiments. Therefore, the true technical spirit of the present invention should be defined by the appended claims.

The invention claimed is:

1. A field-programmable analog array comprising:
   programmable analog timing arrays in which
      a plurality of input pulses are received to output at least one of a single output pulse and a pair of complementary output pulses,
      generation times and pulse widths of the output pulses are determined as functions of arrival times and pulse widths of input pulses received previously and currently, and
      the functions are changeable through a program without physical re-processing,
   wherein a circuit of each of the programmable analog timing arrays is reconfigurable through the program to perform an operation of each of a plurality of analog circuits and analog-digital conversion circuits without physical re-processing of the circuit.

2. The field-programmable analog array of claim 1, wherein the programmable analog timing arrays comprise:
   a current source configured to apply a controllable current;
   a charge accumulator configured to accumulate charge of the current applied by the current source and output an electrical signal resulting from the accumulation;
   a detector configured to detect the electrical signal and output a detection result signal; and
   a memory unit configured to store program information for controlling the current source to adjust the current applied by the current source.

3. The field-programmable analog array of claim 2, wherein a pair of programmable analog timing arrays are provided and complementarily operate.

4. The field-programmable analog array of claim 2, further comprising a latch circuit configured to temporarily store a state of the detection result signal.

5. The field-programmable analog array of claim 2, wherein the programmable analog timing arrays further comprise a switch configured to control an electrical connection between the current source and the charge accumulator, and the switch is controlled by a signal applied from an inside or an outside of the programmable analog timing arrays.

6. The field-programmable analog array of claim 2, wherein the charge accumulator comprises a capacitor bank in which a plurality of capacitors are arranged and a switch, the memory unit further stores program information for controlling closure of the switch and controls closure of the switch according to the program information, and the current is applied to the capacitors through the closed switch.

7. The field-programmable analog array of claim 2, wherein the charge accumulator includes at least one voltage controlled variable capacitor.

8. The field-programmable analog array of claim 2, wherein the programmable analog timing arrays further comprise a reset switch configured to be controlled by the detection result signal and reset the charge accumulator.

9. The field-programmable analog array of claim 2, wherein the detection result signal is a signal output from a relationship between the electrical signal provided by the charge accumulator and a predetermined threshold value.

10. The field-programmable analog array of claim 1, wherein the programmable analog timing arrays comprise:
    a current source configured to output a current;
    a charge-voltage converter unit configured to include a capacitor unit having a controllable capacitance and output a voltage signal generated by applying charge of the current output by the current source to the capacitor unit;
    an output unit configured to receive the voltage signal and output a detection result signal; and
    a memory unit configured to store program information for controlling a capacitance of the capacitor unit included in the charge-voltage converter unit.

11. The field-programmable analog array of claim 10, wherein a pair of programmable analog timing arrays are provided and complementarily operate.

12. The field-programmable analog array of claim 10, wherein the programmable analog timing arrays further comprise a latch circuit configured to temporarily store the detection result signal.

13. The field-programmable analog array of claim 10, wherein the programmable analog timing arrays further comprise a switch configured to control an electrical connection between the current source and the charge-voltage converter unit, and the switch is controlled by a signal applied from an outside of the programmable analog timing arrays.

14. The field-programmable analog array of claim 10, wherein the capacitor unit comprises a capacitor bank including a plurality of capacitors and a switch, and the memory unit further stores program information for controlling closure of the switch and controls the capacitance of the capacitor unit by controlling closure of the switch according to the program information.

15. The field-programmable analog array of claim 10, wherein the programmable analog timing arrays further comprise a reset switch configured to reset the charge-voltage converter unit.

16. The field-programmable analog array of claim 10, wherein the capacitor unit includes at least one voltage controlled variable capacitor.

17. The field-programmable analog array of claim 10, wherein the current applied by the current source is adjustable, and the memory unit further stores program information provided by a user to adjust the current applied by the current source.

18. The field-programmable analog array of claim 10, wherein the detection result signal is a signal output from a relationship between the electrical signal provided by the charge-voltage converter unit and a predetermined threshold value.

19. The field-programmable analog array of claim 1, wherein the field-programmable analog array operates as a relaxation oscillator (RO) through the program.

20. The field-programmable analog array of claim 1, wherein the field-programmable analog array operates as a phase shifter through the program.

21. The field-programmable analog array of claim 1, wherein the field-programmable analog array operates as a phase interpolator (PI) through the program.

22. The field-programmable analog array of claim 1, wherein the field-programmable analog array operates as a pulse width modulator through the program.

23. The field-programmable analog array of claim 1, wherein the field-programmable analog array operates as a pseudo exponential digital control oscillator through the program.

24. A field-programmable mixed signal array comprising:
    at least one field-programmable analog array in which
        a plurality of input pulses are received to output at least one of a single output pulse and a pair of complementary output pulses,
        generation times and pulse widths of the output pulses are determined as functions of arrival times and pulse widths of input pulses received previously and currently, and
        the functions are changeable through a program without physical re-processing;
    at least one field-programmable digital block configured to perform a logic operation which is field-reconfigurable through the program; and
    at least one field-programmable connecting wire block capable of field-reconfiguring connection states of input signals and output signals of each of the at least one field-programmable analog array and the at least one field-programmable digital block,
    wherein a circuit of each of the at least one field-programmable analog array, the at least one field-programmable digital block, and the at least one field-programmable connecting wire block is reconfigurable through the program to perform an operation of a plurality of analog, digital, and analog-digital conversion circuits without physical re-processing of the circuit.

25. The field-programmable mixed signal array of claim 24, further comprising at least one programmable arithmetic logic unit capable of efficiently performing an operation between digital signals composed of a plurality of bits.

26. The field-programmable mixed signal array of claim 24, further comprising a custom cell block in which circuits previously formed according to a function intended by a user are arranged.

27. The field-programmable mixed signal array of claim 24, further comprising a memory unit configured to store the program which is provided by any one or more of a user, the at least one field-programmable digital block, a programmable arithmetic logic unit, and a custom cell block to control at least one of a current source and a charge accumulator.

28. The field-programmable mixed signal array of claim 24, wherein each of the at least one field-programmable analog array comprises:
   a current source;
   a charge accumulator configured to accumulate charge of a current output by the current source and output an accumulation result signal corresponding to the accumulated charge; and
   a programmable analog timing array configured to detect the accumulation result signal and output the detected voltage signal to the at least one field-programmable digital block.

29. The field-programmable mixed signal array of claim 24, wherein the field-programmable mixed signal array operates as a digital pulse width modulator (DPWM) through the program.

30. The field-programmable mixed signal array of claim 24, wherein the field-programmable mixed signal array operates as a time-to-digital converter (TDC) through the program.

31. The field-programmable mixed signal array of claim 24, wherein the field-programmable mixed signal array operates as an analog-digital converter (ADC) through the program.

32. The field-programmable mixed signal array of claim 24, wherein the field-programmable mixed signal array operates as a phase locked loop (PLL) through the program.

33. The field-programmable mixed signal array of claim 24, wherein the field-programmable mixed signal array operates as a direct current (DC)-DC converter, an alternating current (AC)-DC converter, or a DC-AC converter through the program.

* * * * *